US012575082B2

(12) United States Patent
Uhm

(10) Patent No.: US 12,575,082 B2
(45) Date of Patent: Mar. 10, 2026

(54) SEMICONDUCTOR DEVICES

(71) Applicant: Samsung Electronics Co., Ltd.,
Suwon-si (KR)

(72) Inventor: Sanghoon Uhm, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 515 days.

(21) Appl. No.: 18/131,735

(22) Filed: Apr. 6, 2023

(65) Prior Publication Data

US 2024/0032275 A1    Jan. 25, 2024

(30) Foreign Application Priority Data

Jul. 19, 2022    (KR) ........................ 10-2022-0089006

(51) Int. Cl.
H10B 12/00    (2023.01)
(52) U.S. Cl.
CPC ......... H10B 12/315 (2023.02); H10B 12/482
(2023.02)
(58) Field of Classification Search
CPC .. H10B 12/315; H10B 12/482; H10B 12/033;
H10B 12/05; H10B 12/30; H10B 12/34;
H10D 30/6728; H10D 30/6755
See application file for complete search history.

(56) References Cited

U.S. PATENT DOCUMENTS 8,436,350 B2    5/2013    Yamazaki et al.
11,075,305 B2    7/2021    Kanrei

| | | |
|---|---|---|
| 11,171,140 B2 | 11/2021 | Sukekawa |
| 2015/0187956 A1 | 7/2015 | Ahmed |
| 2020/0111917 A1 | 4/2020 | Ramaswamy et al. |
| 2020/0381557 A1 | 12/2020 | Hattori et al. |
| 2021/0183864 A1* | 6/2021 | Ramaswamy ....... H10B 12/488 |
| 2021/0351206 A1 | 11/2021 | Kondo et al. |
| 2021/0408116 A1 | 12/2021 | Wu et al. |
| 2022/0223732 A1* | 7/2022 | Ryu ........................ H10B 12/05 |
| 2023/0055499 A1* | 2/2023 | Lee ........................ H10B 41/40 |

FOREIGN PATENT DOCUMENTS

| | | |
|---|---|---|
| JP | 6930885 B2 | 9/2021 |
| KR | 102237834 B1 | 4/2021 |
| KR | 1020210054019 A | 5/2021 |
| TW | 202218118 A | 5/2022 |

* cited by examiner

*Primary Examiner* — Jonathan Han

(74) *Attorney, Agent, or Firm* — Muir Patent Law, PLLC

(57) ABSTRACT

A semiconductor device includes bit lines, gate electrodes, a
gate insulation pattern, a channel structure, a metal oxide
pattern and a metal pattern on a substrate. The bit lines
extend in a first direction and are spaced apart from each
other in a second direction. The gate electrodes are disposed
on the bit lines, spaced apart from each other in the first
direction, and extend in the second direction. The gate
insulation pattern is formed on a sidewall in the first direc-
tion of the gate electrodes. The channel structure is formed
on a sidewall in the first direction of the gate insulation
pattern. The metal oxide pattern is formed on a sidewall in
the first direction of the channel structure. The metal pattern
is formed on a sidewall in the first direction of the metal
oxide pattern.

20 Claims, 33 Drawing Sheets

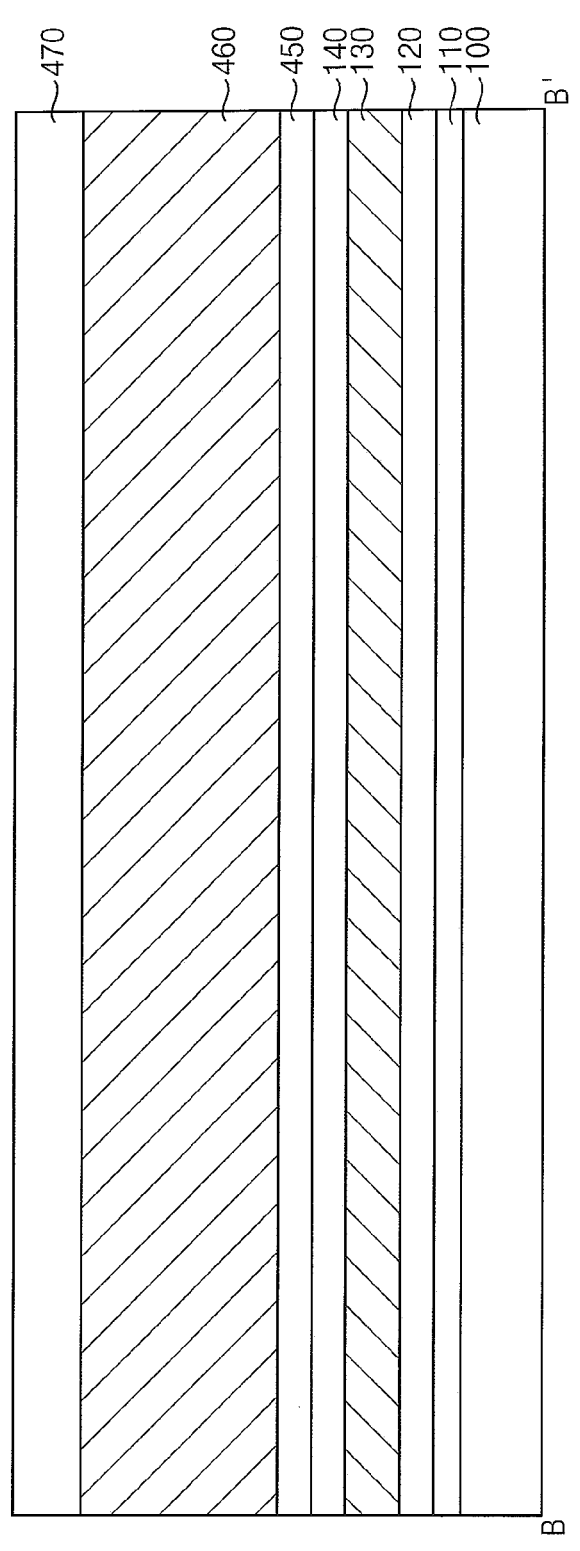
FIG. 26
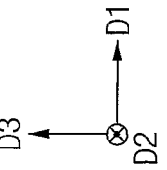

SEMICONDUCTOR DEVICES

CROSS-REFERENCE TO RELATED APPLICATION

This application claims priority under 35 U.S.C. § 119 to Korean Patent Application No. 10-2022-0089006 filed on Jul. 19, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a memory device including a vertical channel.

DISCUSSION OF RELATED ART

A memory device including a vertical channel transistor has been developed in order to increase the integration degree of the memory device, and recently, oxide semiconductor has been used as a channel. Thus, a method of increasing the reliability of the electrical characteristics of the channel including oxide semiconductor is needed.

SUMMARY

Example embodiments provide a semiconductor device having improved characteristics.

According to example embodiments of the inventive concepts, there is provided a semiconductor device. The semiconductor device may include bit lines, gate electrodes, a gate insulation pattern, a channel structure, a metal oxide pattern and a metal pattern on a substrate. The bit lines may extend in a first direction parallel to an upper surface of the substrate and may be spaced apart from each other in a second direction parallel to the upper surface of the substrate and crossing the first direction. The gate electrodes may be disposed on the bit lines, may be spaced apart from each other in the first direction, and may extend in the second direction. The gate insulation pattern may be formed on a sidewall in the first direction of each of the gate electrodes. The channel structure may be formed on a sidewall in the first direction of the gate insulation pattern. The metal oxide pattern may be formed on a sidewall in the first direction of the channel structure. The metal pattern may be formed on a sidewall in the first direction of the metal oxide pattern.

According to example embodiments of the inventive concepts, there is provided a semiconductor device. The semiconductor device may include bit lines, gate electrodes, a gate insulation pattern, a channel structure and a metal pattern on a substrate. The bit lines may extend in a first direction parallel to an upper surface of the substrate, and may be spaced apart from each other in a second direction parallel to the upper surface of the substrate and crossing the first direction. The gate electrodes may be disposed on the bit lines, may be spaced apart from each other in the first direction, and may extend in the second direction. The gate insulation pattern may be formed on a sidewall in the first direction of the gate electrodes. The channel structure may be formed on a sidewall in the first direction of the gate insulation pattern. The metal pattern may be formed on a sidewall in the first direction of the channel structure. The channel structure may include a crystalline channel including a crystalline oxide semiconductor material and an amorphous channel on and beneath the crystalline channel and including an amorphous oxide semiconductor material.

According to example embodiments of the inventive concepts, there is provided a semiconductor device. The semiconductor device may include bit lines, gate electrodes, a gate insulation pattern, a channel structure, a metal oxide pattern, a metal pattern, a contact plug and a capacitor. The bit lines may extend in a first direction parallel to an upper surface of the substrate, and may be spaced apart from each other in a second direction parallel to the upper surface of the substrate and crossing the first direction. The gate electrodes may be disposed on the bit lines, may be spaced apart from each other in the first direction, and may extend in the second direction. The gate insulation pattern may be formed on a sidewall in the first direction of each of the gate electrodes. The channel structure may be formed on a sidewall in the first direction of the gate insulation pattern, and the channel structure may include a crystalline channel including a crystalline oxide semiconductor material and an amorphous channel on and beneath the crystalline channel and including an amorphous oxide semiconductor material. The metal oxide pattern may be formed on a sidewall in the first direction of the channel structure. The metal pattern may be formed on a sidewall in the first direction of the metal oxide pattern. The contact plug may contact an upper surface of the channel structure, and the contact plug may be disposed at each of areas where the bit lines and the gate electrodes cross each other in a third direction perpendicular to the upper surface of the substrate. The capacitor may be formed on the contact plug.

In the method of manufacturing the semiconductor device, the channel including an amorphous oxide semiconductor material may be formed to contact the metal pattern including a metal having a high electron affinity. Thus, the portion of the channel adjacent to the metal pattern may be converted into the crystalline channel including a crystalline oxide semiconductor material during subsequent processes generating heat, and the semiconductor device may have an increased on-current.

Additionally, the metal pattern may cure the oxygen vacancy included in the channel, and thus the reliability of the channel may be enhanced.

BRIEF DESCRIPTION OF THE DRAWINGS

FIGS. 1 and 2 are a plan view and a cross-sectional view, respectively, illustrating a semiconductor device according to example embodiments.

FIG. 21 is a cross-sectional view illustrating a semiconductor device in accordance with example embodiments.

FIG. 23 is a cross-sectional view illustrating a semiconductor device in accordance with example embodiments.

FIG. 25 is a cross-sectional view illustrating a semiconductor device in accordance with example embodiments.

FIGS. 26 to 29 are cross-sectional views illustrating a method of manufacturing a semiconductor device in accordance with example embodiments.

DETAILED DESCRIPTION

The above and other aspects and features of a semiconductor device and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Hereinafter, in the specification (and not necessarily in the claims), two horizontal directions substantially parallel to an upper surface of a substrate may be referred to as first and second directions D1 and D2, respectively, and a vertical direction substantially perpendicular to the upper surface of the substrate may be referred to as a third direction D3. In example embodiments, the first and second directions are substantially perpendicular to each other.

Figure 1:
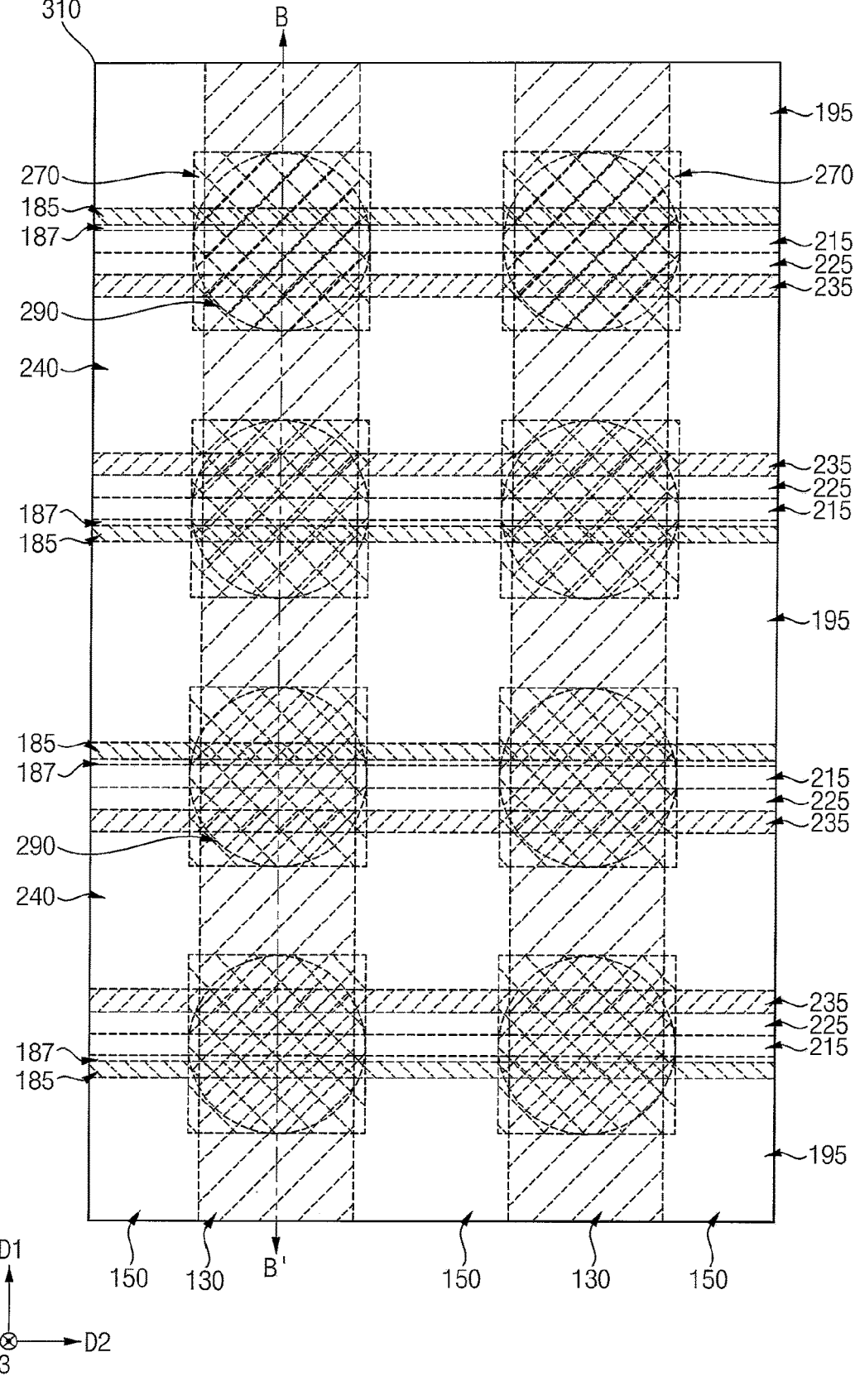
Figure 2:
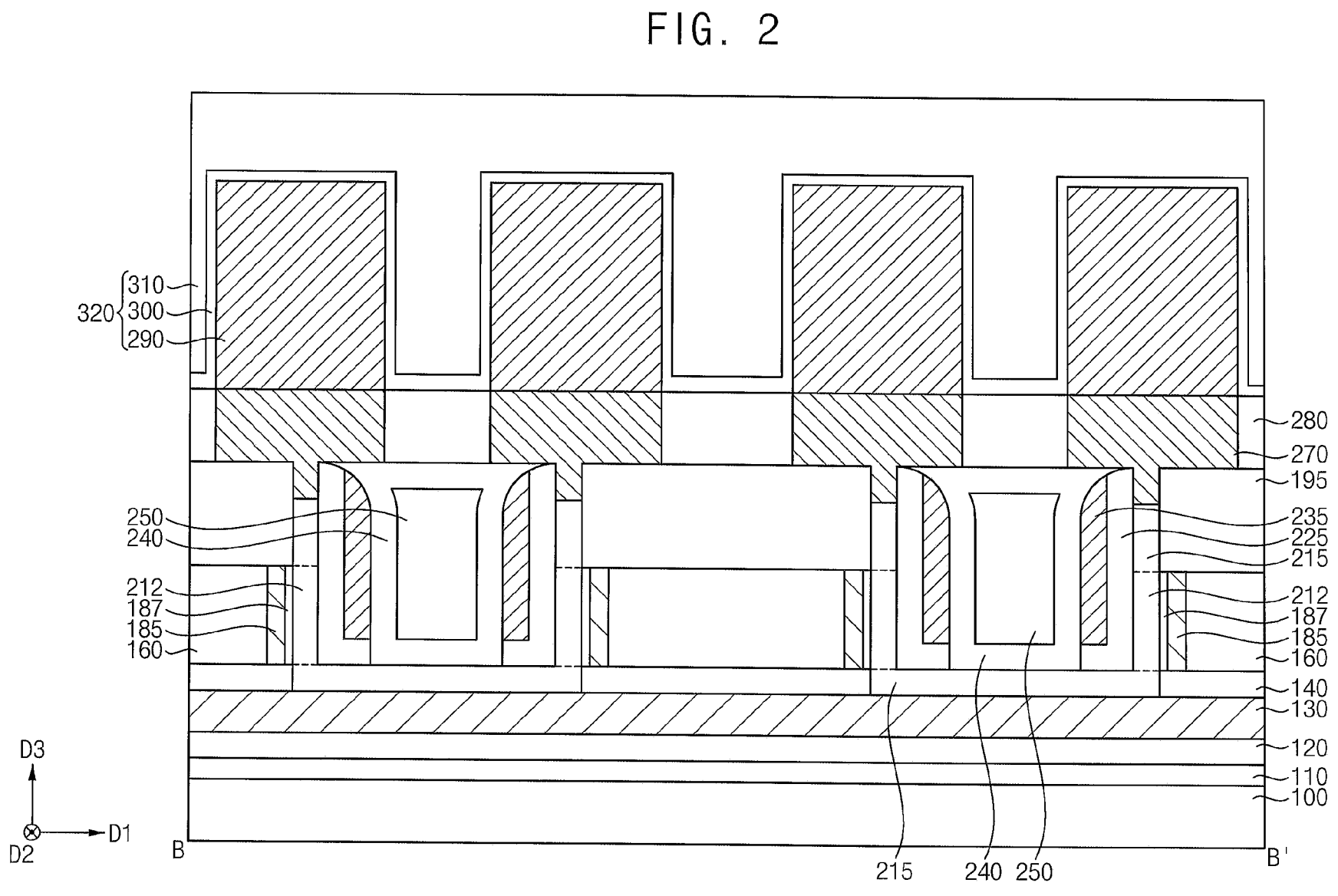

FIGS. 1 and 2 are a plan view and a cross-sectional view, respectively, illustrating a semiconductor device according to example embodiments. FIG. 2 is a cross-sectional view taken along line B-B' of FIG. 1.

Referring to FIGS. 1 and 2, the semiconductor device may include a bit line structure, a gate electrode 235, a gate insulation pattern 225, a channel structure, a first metal pattern 185, a first metal oxide pattern 187, a contact plug 270 and a capacitor 320 on a substrate 100.

The semiconductor device may further include a first insulation layer 110, a fourth insulation pattern 240, and first to fifth insulating interlayer patterns 150, 160, 195, 250 and 280.

The substrate 100 may include, e.g., a semiconductor material, an insulation material or a conductive material.

Figure 3:
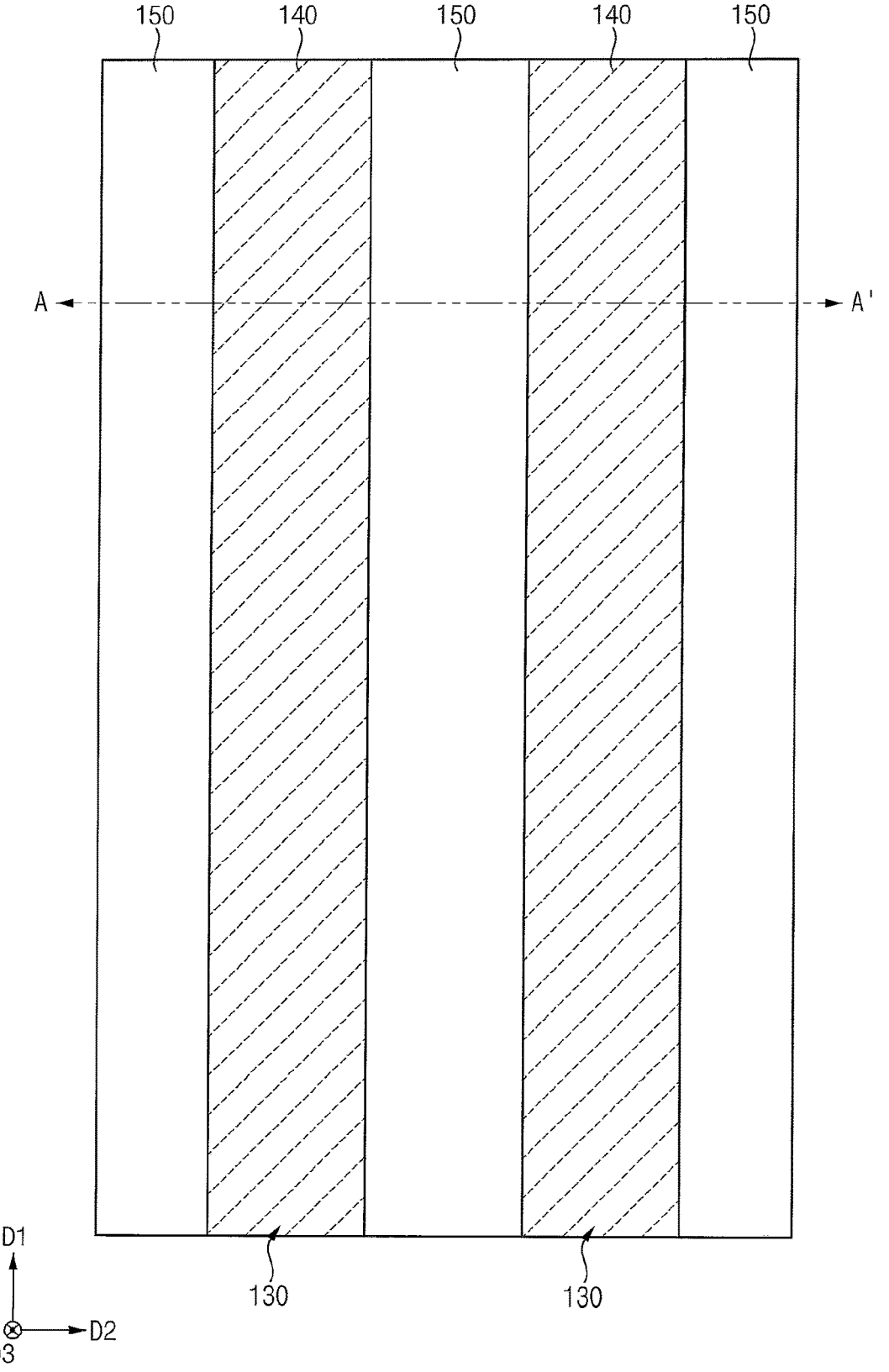
FIGS. 3 to 18 are plan views and cross-sectional views illustrating a method of manufacturing a semiconductor device in accordance with example embodiments.
Figure 4:
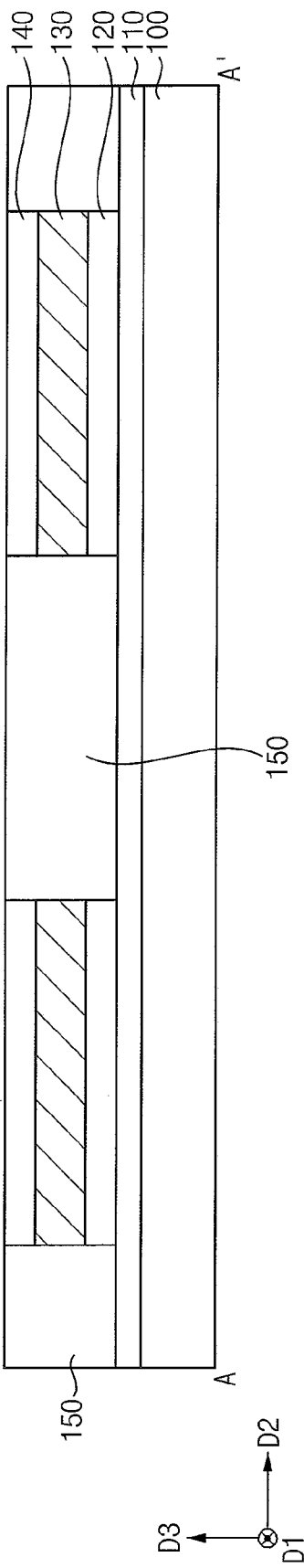

Referring to FIGS. 1 and 2 together with FIGS. 3 and 4, the first insulation layer 110 may be formed on the substrate 100, and the bit line structure may extend in the first direction D1 on the first insulation layer 110.

In example embodiments, the bit line structure may include a second insulation pattern 120, a bit line 130 and a third insulation pattern 140 sequentially stacked on the first insulation layer 110 in the third direction D3. Each of the second insulation pattern 120 and the bit line 130 may extend in the first direction D1, and a plurality of third insulation patterns 140 may be spaced apart from each other in the first direction D1 on the bit line 130.

In example embodiments, a plurality of bit line structures may be spaced apart from each other in the second direction D2, and the first insulating interlayer pattern 150 may extend in the first direction D1 on the first insulation layer 110 between neighboring ones of the bit line structures in the second direction D2.

Each of the first insulation layer 110 and the first insulating interlayer pattern 150 may include an oxide, e.g., silicon oxide, the bit line 130 may include a conductive material, e.g., a metal, a metal nitride, a metal silicide, and each of the second and third insulation patterns 120 and 140 may include an insulating nitride, e.g., silicon nitride.

The second insulating interlayer pattern 160 extending in the second direction D2 may be formed on the third insulation pattern 140 and the first insulating interlayer pattern 150, and the first metal pattern 185 and the first metal oxide pattern 187 may be stacked in the first direction D1 on each of opposite sidewalls of the second insulating interlayer pattern 160 in the first direction D1. Additionally, the third insulating interlayer pattern 195 may be formed on the second insulating interlayer pattern 160, the first metal pattern 185 and the first metal oxide pattern 187, and may extend in the second direction D2.

The second insulating interlayer pattern 160 may include an oxide, e.g., silicon oxide. The first metal pattern 185 may include a metal having a high electron affinity, e.g., titanium, tantalum, molybdenum, tungsten, etc. The first metal oxide pattern 187 may include an oxide of the metal included in the first metal pattern 185, e.g., titanium oxide, tantalum oxide, molybdenum oxide, tungsten oxide, etc.

Hereinafter, the third insulation pattern 140, the second insulation pattern 160, the first metal pattern 185, the first metal oxide pattern 187 and the third insulating interlayer pattern 195 may be collectively referred to as a first bar structure. In example embodiments, the first bar structure may extend in the first direction D1, and a plurality of first bar structures may be spaced apart from each other in the second direction D2.

The fourth insulating interlayer pattern 250 extending in the second direction D2 and the fourth insulation pattern 240 surrounding the fourth insulating interlayer pattern 250 may be formed between ones of the first bar structures neighboring in the second direction D2, and the channel structure, the gate insulation pattern 225 and the gate electrode 235 may be formed between the first metal oxide pattern 187 included in the first bar structure and the fourth insulation pattern 240.

The fourth insulating interlayer pattern 250 may include an oxide, e.g., silicon oxide, and the fourth insulation pattern 240 may include an insulating nitride, e.g., silicon nitride.

The channel structure may extend in the second direction D2, and may contact upper surfaces of the bit line 130 and the first insulating interlayer pattern 150. Alternatively, a plurality of channel structures may be spaced apart from each other in the second direction D2, and each of the channel structures may contact the upper surface of the bit line 130. The channel structure may further contact sidewalls of the first metal oxide patterns 187 and the third insulating interlayer pattern 195 included in neighboring ones of the first bar structures in the first direction D1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In example embodiments, the channel structure may include a crystalline channel 212 contacting the sidewall of the first metal oxide pattern 187, and an amorphous channel 215 on the crystalline channel 212 and contacting a lower sidewall of the third insulating interlayer pattern 195 or beneath the crystalline channel 212 and contacting an upper surface of the bit line 130. The amorphous channel 215 may also contact a sidewall of the third insulation pattern 140.

In example embodiments, an uppermost surface of the channel structure may be lower than an upper surface of the third insulating interlayer pattern 195 or an uppermost surface of the gate insulation pattern 225.

In example embodiments, each of the crystalline channel 212 and the amorphous channel 215 may include an oxide semiconductor material. The oxide semiconductor material may include, or may be formed of, at least one of zinc tin oxide (ZTO), indium zinc oxide (IZO) zinc oxide ($ZnO_x$), indium gallium zinc oxide (IGZO), indium gallium silicon oxide (IGSO), Indium oxide ($InO_x$, $In_2O_3$), tin oxide ($SnO_2$), titanium oxide ($TiO_x$), zinc oxide nitride ($Zn_xOyN_z$), magnesium zinc oxide ($Mg_xZn_yO_2$), indium zinc oxide ($In_xZn_yO_a$), indium gallium zinc oxide ($In_xGa_yZn_zO$), zirconium indium zinc oxide ($Zr_xIn_yZn_zO_a$), hafnium indium zinc oxide ($Hf_xIn_yZn_zO_3$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_xO_a$), zirconium zinc tin oxide ($Zr_xZn_ySn_zO_a$), and indium gallium silicon oxide (InGaSiO).

The gate insulation pattern 225 may extend in the second direction D2, and may contact an inner sidewall of the channel structure, and an upper surface of a portion of the channel structure on the bit line 130. In example embodiments, a cross-section of the gate insulation pattern 225 in the first direction D1 may have an "L" shape. In example embodiments, an uppermost surface of the gate insulation pattern 225 may be substantially coplanar with an upper surface of the third insulating interlayer pattern 195. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The gate electrode 235 may extend in the second direction D2, and may contact an inner sidewall of the gate insulation pattern 225, and an upper surface of a portion of the gate insulation pattern 225 on the channel structure. The gate electrode 235 may include a conductive material, e.g., a metal, a metal nitride, a metal silicide, etc.

The contact plug 270 may contact an upper surface of the channel structure at each of areas where the bit lines 130 and the gate electrodes 235 cross each other in the third direction D3. The contact plug 270 may contact upper surfaces of the gate insulation pattern 225, the third insulating interlayer pattern 195 and the third insulation pattern 240 adjacent to the channel structure, and may be spaced apart from an upper surface of the gate electrode 235.

In example embodiments, a plurality of contact plugs 270 may be spaced apart from each other in the first and second directions D1 and D2, and may be arranged in a lattice pattern or a honeycomb pattern in a plan view.

In example embodiments, the contact plug 270 may include a lower portion having a first width in the first direction D1 and an upper portion having a second width in the first direction D1 that is greater than the first width. A lower surface of the contact plug 270 may be lower than the upper surfaces of the gate insulation pattern 225 and the third insulating interlayer pattern 195 and may be higher than upper surfaces of the first metal pattern 185 and the first metal oxide pattern 187.

The contact plug 270 may include, or may be formed of, a conductive material, e.g., a metal, a metal nitride, a metal silicide, etc.

The fifth insulating interlayer pattern 280 may be formed on the third insulating interlayer pattern 195, the gate insulation pattern 225 and the fourth insulation pattern 240, and may cover a sidewall of the contact plug 270. The fifth insulating interlayer pattern 280 may include an oxide, e.g., silicon oxide.

The capacitor 320 may include first and second capacitor electrodes 290 and 310 and a dielectric layer 300 therebetween. The first capacitor electrode 290 may be formed on the contact plug 270, the dielectric layer 300 may be formed on an upper surface and a sidewall of the first capacitor electrode 290 and an upper surface of the fifth insulating interlayer pattern 280, and the second capacitor electrode 310 may be formed on the dielectric layer 300.

As the plurality of contact plugs 270 are spaced apart from each other in the first and second directions D1 and D2, a plurality of first capacitor electrodes 290 may be spaced apart from each other in the first and second directions D1 and D2.

In example embodiments, the first capacitor electrode 290 may have a shape of a circle, an ellipse, a polygon, a polygon with rounded corners, etc., in a plan view. The first capacitor electrodes 290 may be arranged in a lattice pattern or a honeycomb pattern in a plan view.

In the semiconductor device, current may flow in the third direction D3, that is, in the vertical direction in the channel structure between the bit line 130 and the contact plug 270, and thus the semiconductor device may include a vertical channel transistor (VCT) having a vertical channel.

In example embodiments, the channel structure may include the crystalline channel 212 adjacent to the gate electrode 235, and the crystalline channel 212 may include a crystalline oxide semiconductor material. The crystalline channel 212 may include grains having large sizes, and thus the VCT including the channel structure containing the crystalline channel 212 may have an increased on-current.

Additionally, the first metal oxide pattern 187 may be formed between the channel structure including an oxide semiconductor material and the first metal pattern 185, as described below. As the first metal oxide pattern 187 is formed, oxygen vacancy of the channel structure may be cured so as to enhance the reliability of the channel structure.

FIGS. 3 to 18 are plan views and cross-sectional views illustrating a method of manufacturing a semiconductor device in accordance with example embodiments. Particularly, FIGS. 3, 5, 8, 10, 13, 15 and 17 are the plan views, and FIG. 4 is a cross-sectional view taken along line A-A' of FIG. 3, and FIGS. 6, 7, 9, 11, 12, 14, 16 and 18 are cross-sectional views taken along lines B-B' of corresponding plan views, respectively.

Referring to FIGS. 3 and 4, a first insulation layer 110, a second insulation layer, a bit line layer and a third insulation layer may be sequentially stacked on a substrate 100, and the third insulation layer, the bit line layer and the second insulation layer may be patterned to form a third insulation pattern 140, a bit line 130 and a second insulation pattern 120, respectively.

The second insulation pattern 120, the bit line 130 and the third insulation pattern 140 sequentially stacked on the substrate 100 may be referred to as a bit line structure. In example embodiments, the bit line structure may extend in the first direction D1 on the substrate 100, and a plurality of bit line structures may be spaced apart from each other in the second direction D2. Thus, a first opening may be formed between neighboring ones of the bit line structures in the second direction D2 to expose an upper surface of the first insulation layer 110.

A first insulating interlayer may be formed on the bit line structures and the first insulation layer 110 to fill the first opening, and an upper portion of the first insulating interlayer may be planarized until upper surfaces of the bit line structures are exposed. Thus, a first insulating interlayer pattern 150 extending in the first direction D1 may be formed between the bit line structures.

In example embodiments, the planarization process may include a chemical mechanical polishing (CMP) process and/or an etch back process.

Figure 5:
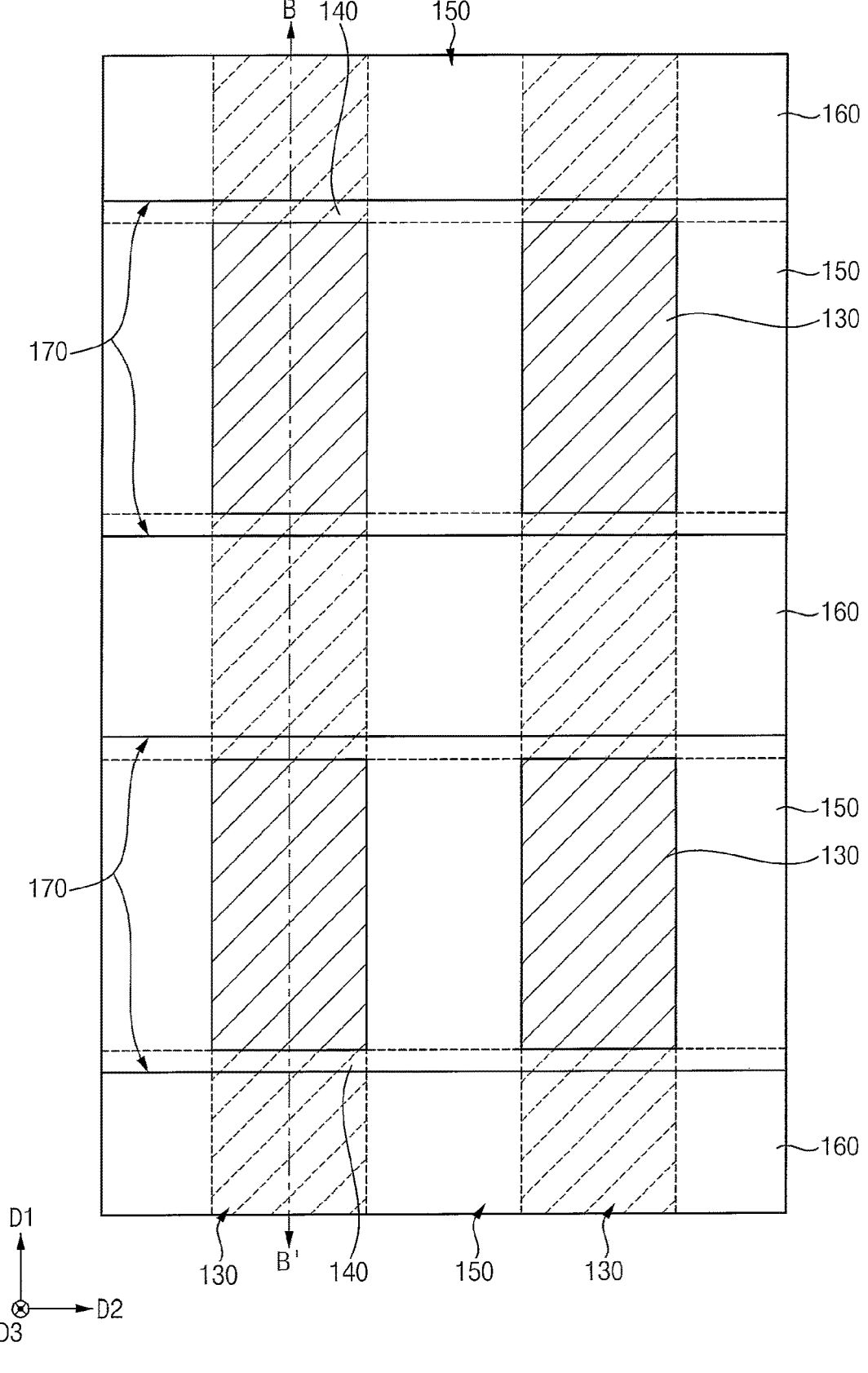
Figure 6:
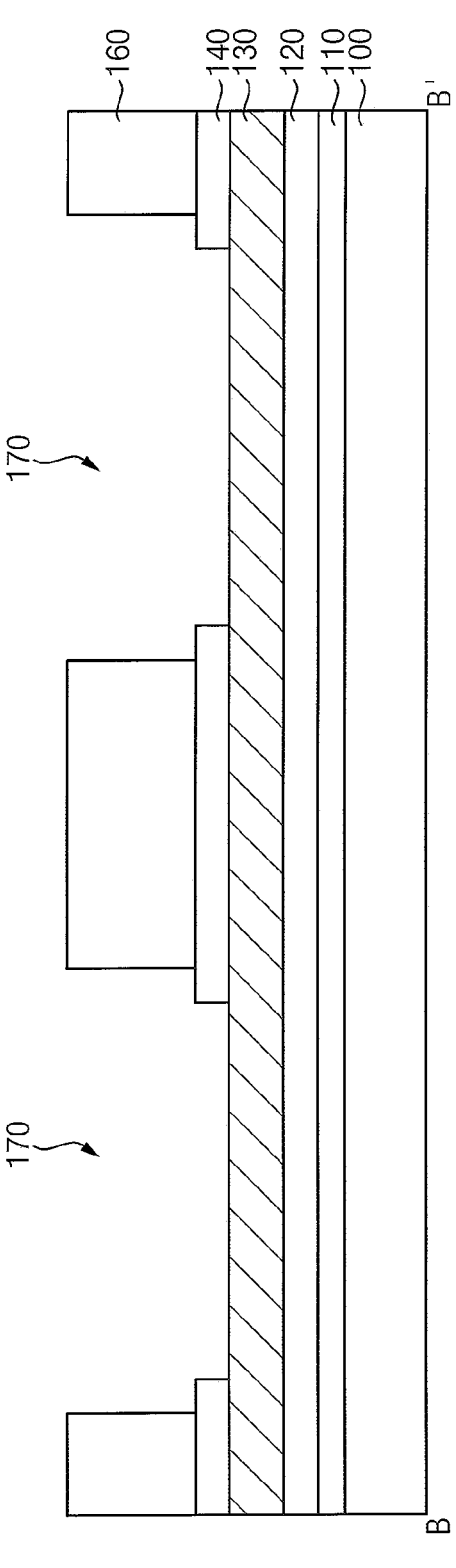

Referring to FIGS. 5 and 6, a second insulating interlayer may be formed on the bit line structures and the first insulating interlayer patterns 150, and the second insulating interlayer may be partially removed by, e.g., a dry etching process to form a second opening 170 extending in the second direction D2 and exposing upper surfaces of the third insulation pattern 140 and the first insulating interlayer pattern 150.

Thus, the second insulating interlayer may be divided into a plurality of second insulating interlayer patterns 160, each of which may extend in the second direction D2, spaced apart from each other in the first direction D1.

A portion of the third insulation pattern 140 exposed by the second opening 170 may be removed so that the third insulation pattern 140 extending in the first direction D1 may be divided into a plurality of parts spaced apart from each other in the first direction D1, and an upper portion of the first insulating interlayer pattern 150 exposed by the second opening 170 may also be removed.

A sidewall of the second insulating interlayer pattern 160 exposed by the second opening 170 may be further removed, and thus a width of the second opening 170 in the first direction D1 may be enlarged. As the width of the second opening 170 in the first direction D1 increases, a portion of the third insulation pattern 140 on the bit line 130, that is, a portion of the third insulation pattern 140 at each of opposite edge portions of the second opening 170 in the first direction may be exposed.

Figure 7:
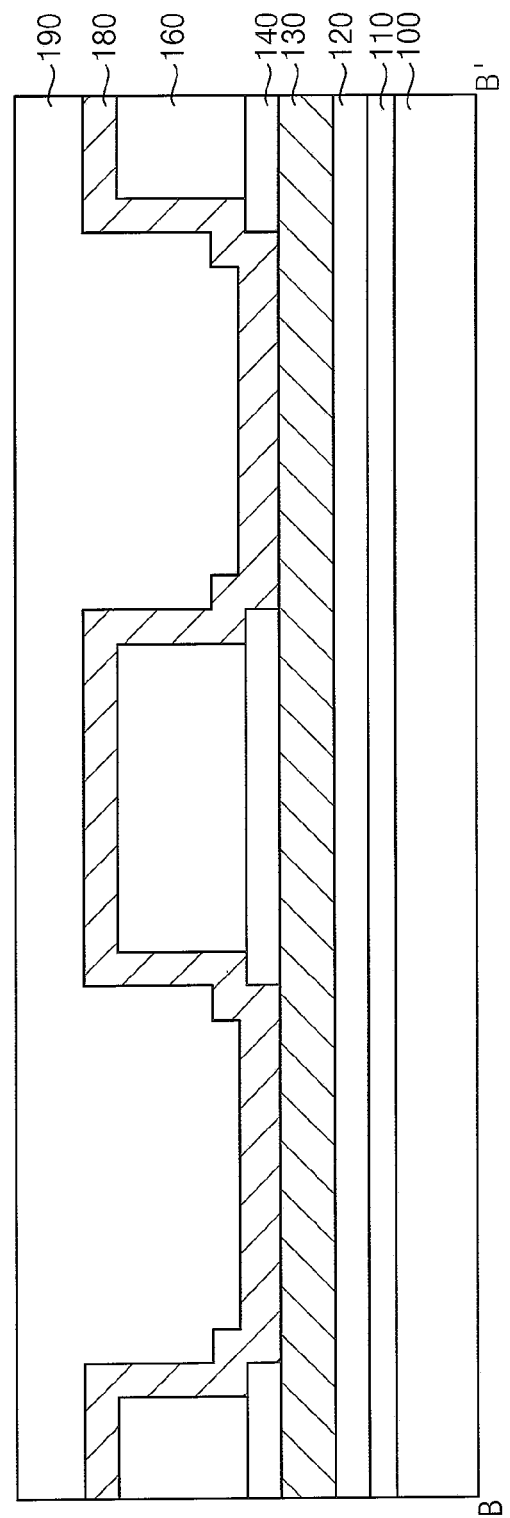
Figure 7:
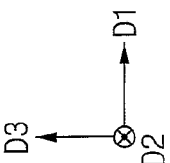

Referring to FIG. 7, a first metal layer 180 may be formed on upper surfaces of the bit line 130 and the first insulating interlayer pattern 150, and an upper surface and a sidewall of the third insulation pattern 140 exposed by the second opening 170, and a sidewall and an upper surface of the second insulating interlayer pattern 160, and a third insulating interlayer 190 may be formed on the first metal layer 180 to fill a remaining portion of the second opening 170.

In example embodiments, the first metal layer 180 may be conformally formed by a deposition process, e.g., an ALD process, a CVD process, etc.

Figure 8:
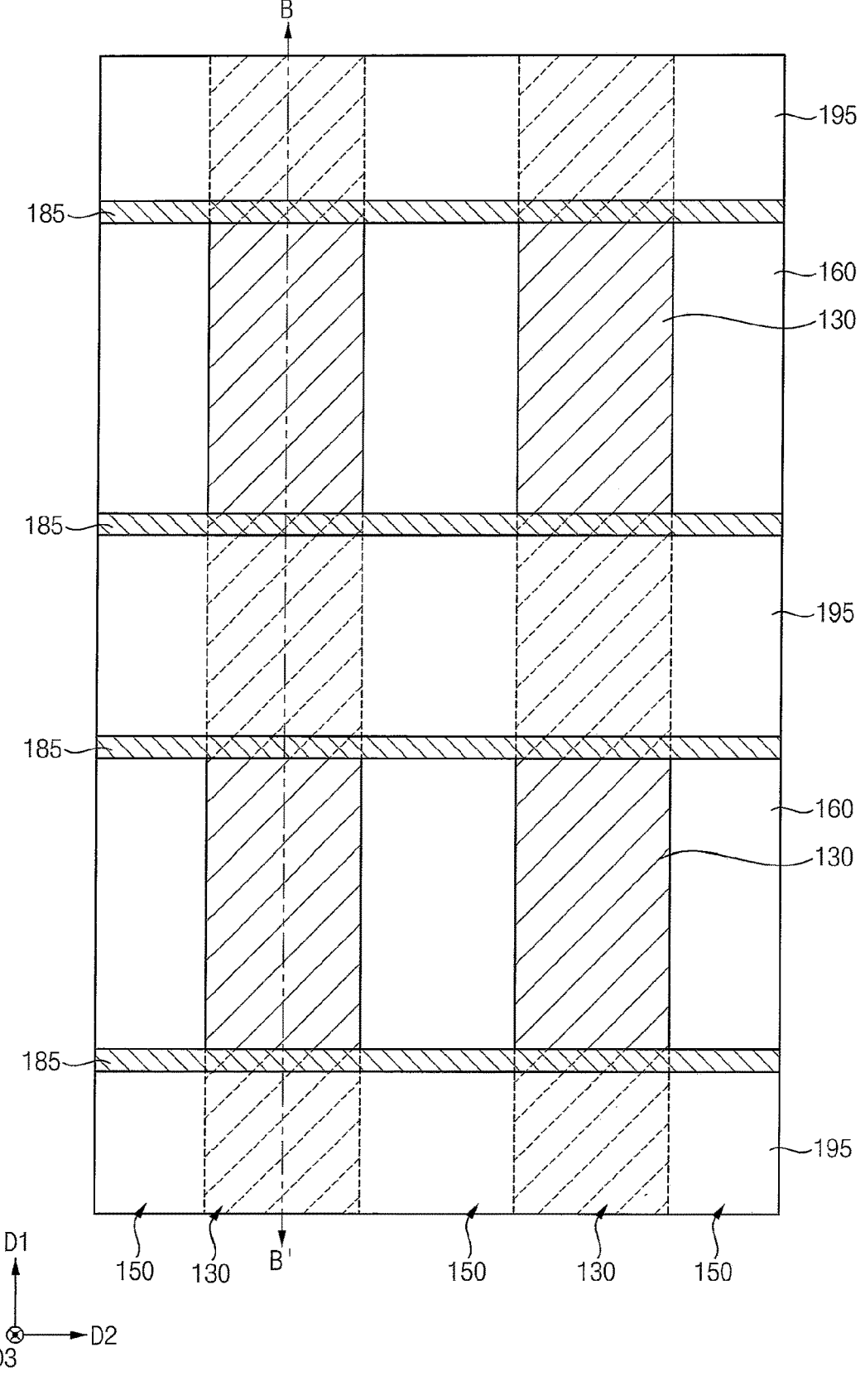
Figure 9:
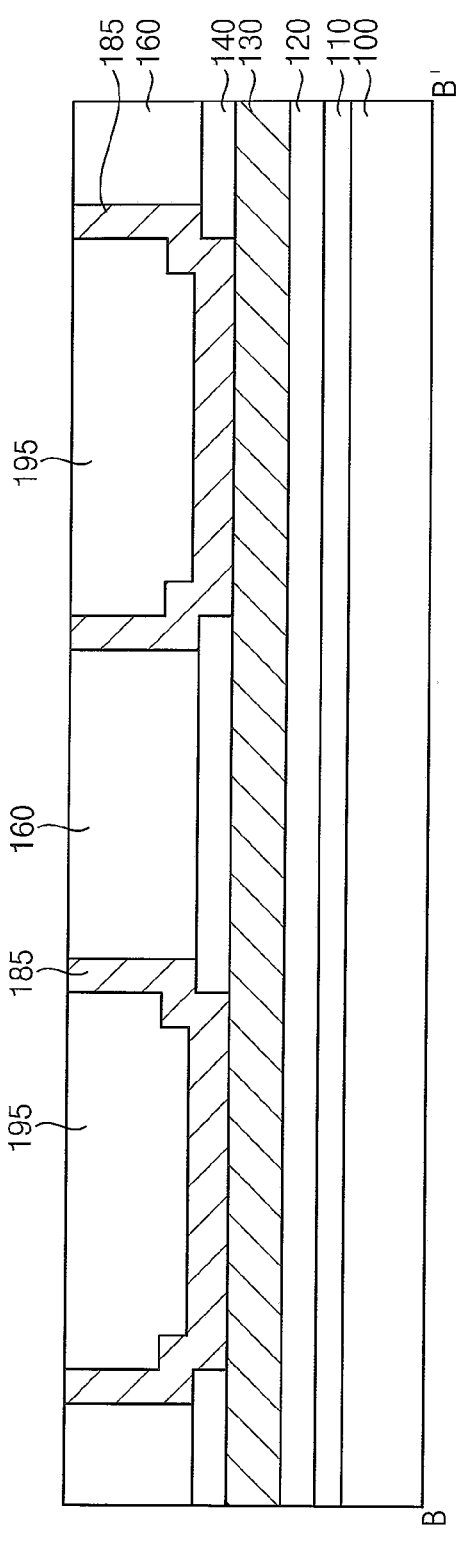
Figure 9:
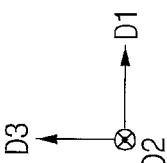

Referring to FIGS. 8 and 9, upper portions of the third insulating interlayer 190 and the first metal layer 180 may be planarized until the upper surface of the second insulating interlayer pattern 160 is exposed.

Thus, the third insulating interlayer 190 may be divided into a plurality of third insulating interlayer patterns 195 each of which may extend in the second direction D2, and the first metal layer 180 may be divided into a plurality of first metal patterns 185 each of which may extend in the second direction D2.

A sidewall and a lower surface of each of the third insulating interlayer patterns 195 may be covered by the first metal pattern 185.

Figure 10:
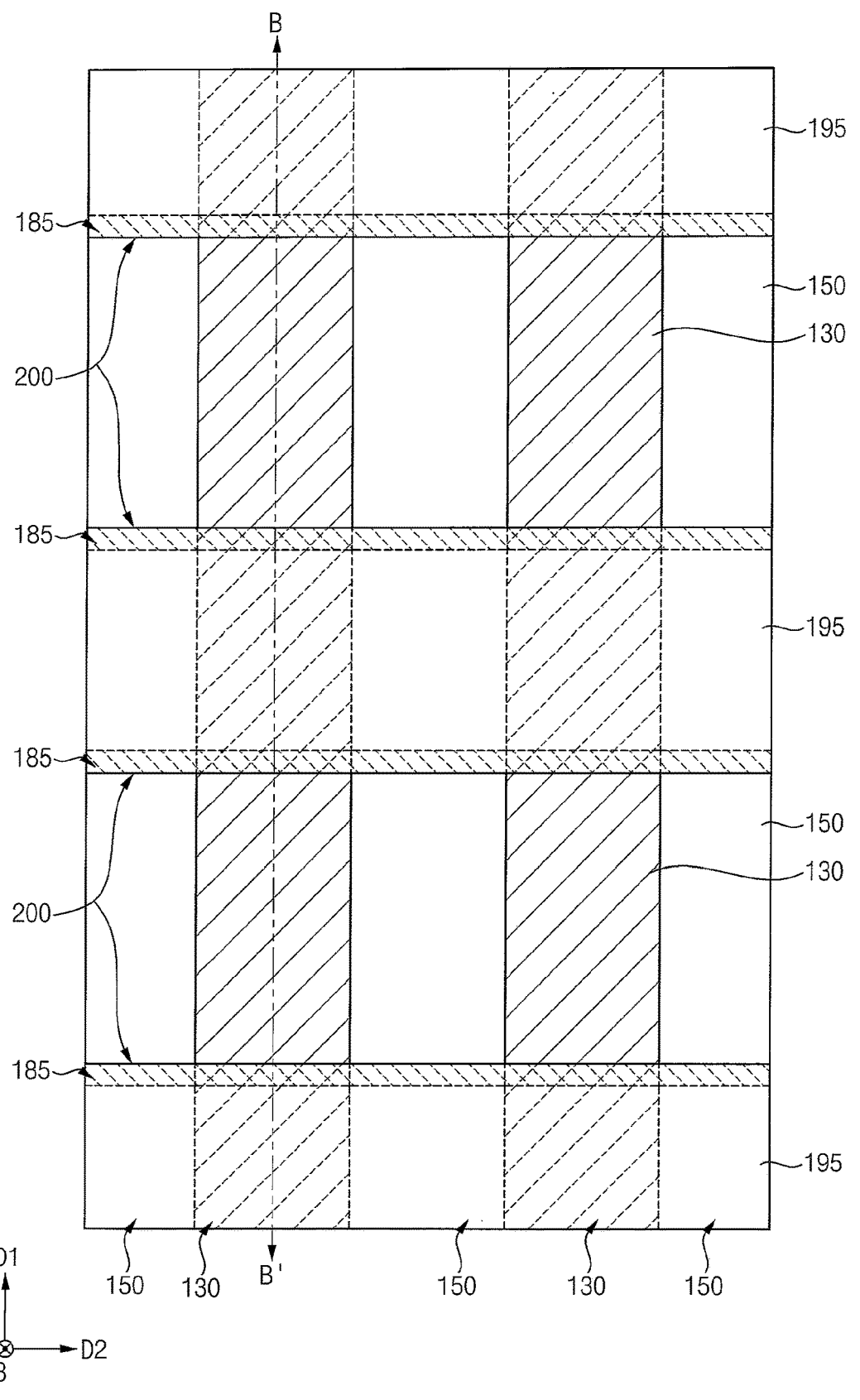
Figure 11:
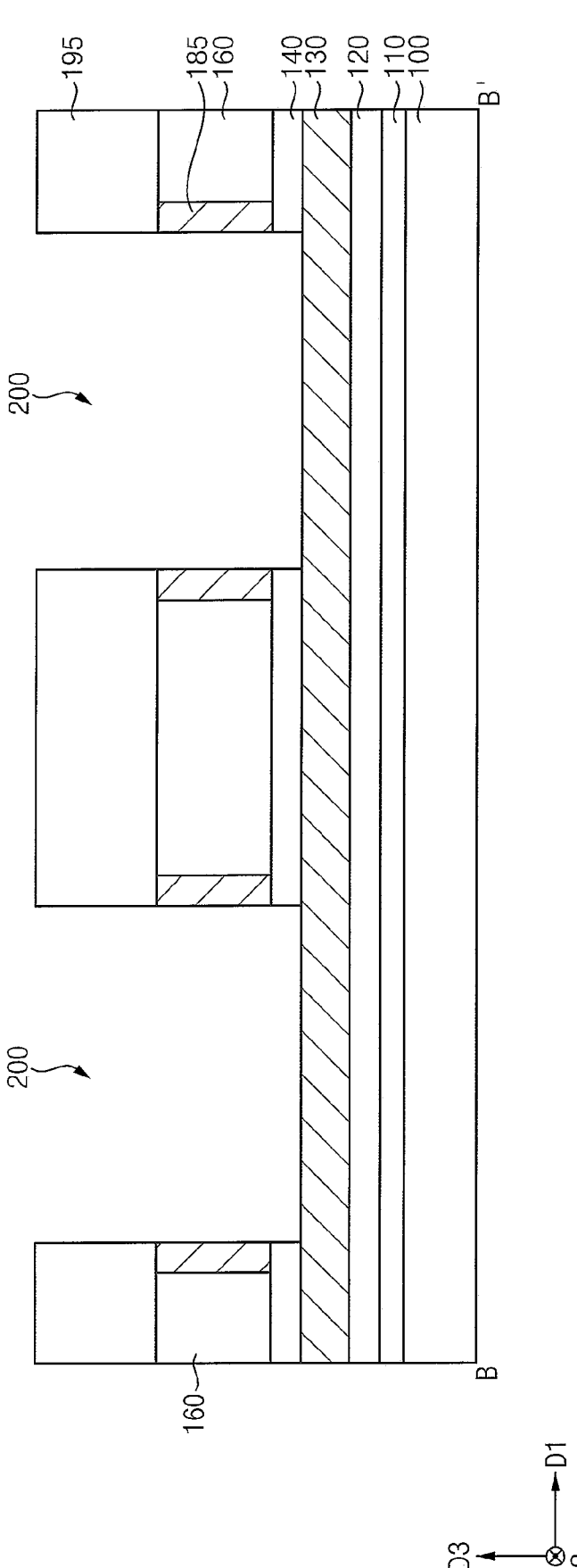

Referring to FIGS. 10 and 11, the third insulating interlayer 190 may be formed again on the third insulating interlayer patterns 195 and the first metal patterns 185, and may be merged with the third insulating interlayer patterns 195.

Portions of the third insulating interlayer pattern 195, the first metal pattern 185 and the third insulation pattern 140 may be removed by, e.g., a dry etching process.

As the dry etching process is performed, a portion of the third insulating interlayer pattern 195 of which a lower surface and a sidewall is covered by the first metal pattern 185 and a portion of the third insulating interlayer pattern 195 thereon may be removed. Additionally, a portion of the first metal pattern 185 on the upper surfaces of the bit line 130 and the first insulating interlayer pattern 150, and a portion of the first metal pattern 185 on the upper surface and the sidewall of the third insulation pattern 140 may be removed, and each of opposite edge portions of the third insulation pattern 140 in the first direction D1 may be removed.

Thus, the third insulating interlayer pattern 195 and the first metal pattern 185, the second insulating interlayer pattern 160 and the third insulation pattern 140 under the third insulating interlayer pattern 195 may form a first bar structure extending in the second direction D2, and a third opening 200 extending in the second direction D2 may be formed between neighboring ones of the first bar structures to expose the upper surfaces of the bit line 130 and the first insulating interlayer pattern 150.

In example embodiments, the first metal pattern 185 may extend in the second direction D2 on the third insulation pattern 140 and the first insulating interlayer pattern 150, and a plurality of first metal patterns 185 may be spaced apart from each other in the first direction D1.

Figure 12:
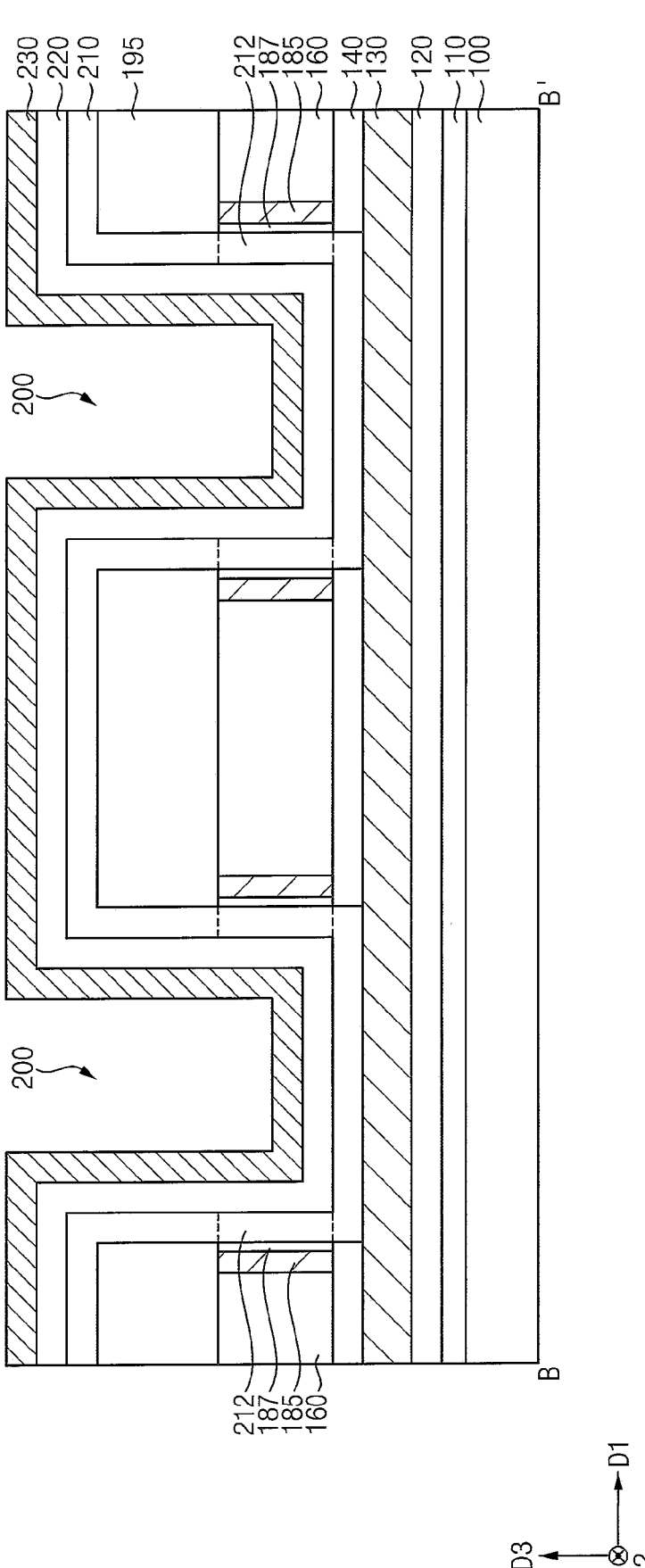

Referring to FIG. 12, a channel layer 210, a gate insulation layer 220 and a gate electrode layer 230 may be sequentially stacked on the upper surfaces of the bit line 130 and the first insulating interlayer pattern 150 exposed by the third opening 200 and an upper surface and a sidewall of the first bar structure.

In example embodiments, the channel layer 210, the gate insulation layer 220 and the gate electrode layer 230 may be formed by a deposition process, e.g., an ALD process, a CVD process, etc.

In example embodiments, the channel layer 210 may include an amorphous oxide semiconductor material at a relatively low temperature, while the gate insulation layer 220 and the gate electrode layer 230 may be formed at a relatively high temperature.

During the deposition process for forming the gate insulation layer 220 and the gate electrode layer 230 that may be performed at the relatively high temperature, a portion of the channel layer 210 contacting the first metal pattern 185 may be converted into a crystalline channel 212, and a portion of the first metal pattern 185 contacting the crystalline channel 212 may be converted into a first metal oxide pattern 187.

For example, an amorphous oxide semiconductor material included in the channel layer 210, e.g., IGZO may be crystallized by heat that may be generated during the deposition process for forming the gate insulation layer 220 and the gate electrode layer 230. The first metal pattern 185 contacting the channel layer 210 may include the metal having the high electron affinity, e.g., titanium, tantalum, molybdenum, etc., so that the crystallization of the amorphous oxide semiconductor material included in the channel layer 210 may be accelerated.

Thus, the channel layer 210 may be divided into the crystalline channel 212, which may be adjacent to the first metal pattern 185 and include a crystalline oxide semiconductor material, and an amorphous channel layer 210, which may be distal to the first metal pattern 185 and include an amorphous oxide semiconductor material.

During the deposition process for forming the gate insulation layer 220 and the gate electrode layer 230, the portion of the first metal pattern 185 contacting the crystalline channel 212 including the oxide semiconductor material may absorb oxygen from the channel layer 210 to be converted into the first metal oxide pattern 187 including a metal oxide, and thus oxygen vacancy of the oxide semiconductor material included in the crystalline channel 212 adjacent to the first metal oxide pattern 187 may be cured.

For example, as the deposition process for forming the channel layer 210, the gate insulation layer 220 and the gate electrode layer 230 is performed, the first metal pattern 185 may be divided into the first metal pattern 185 and the first metal oxide pattern 187 stacked in the first direction D1.

Figure 13:
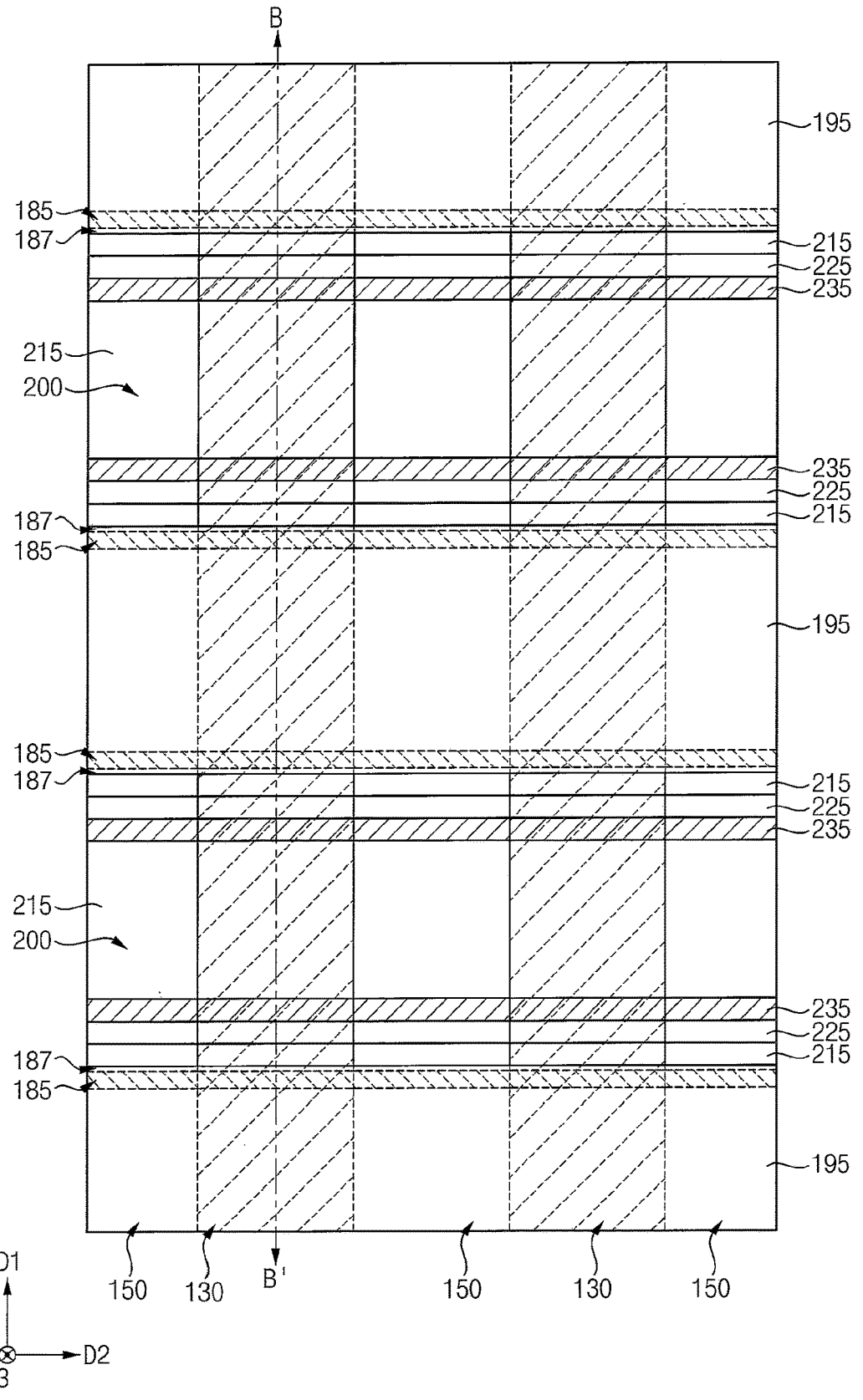
Figure 14:
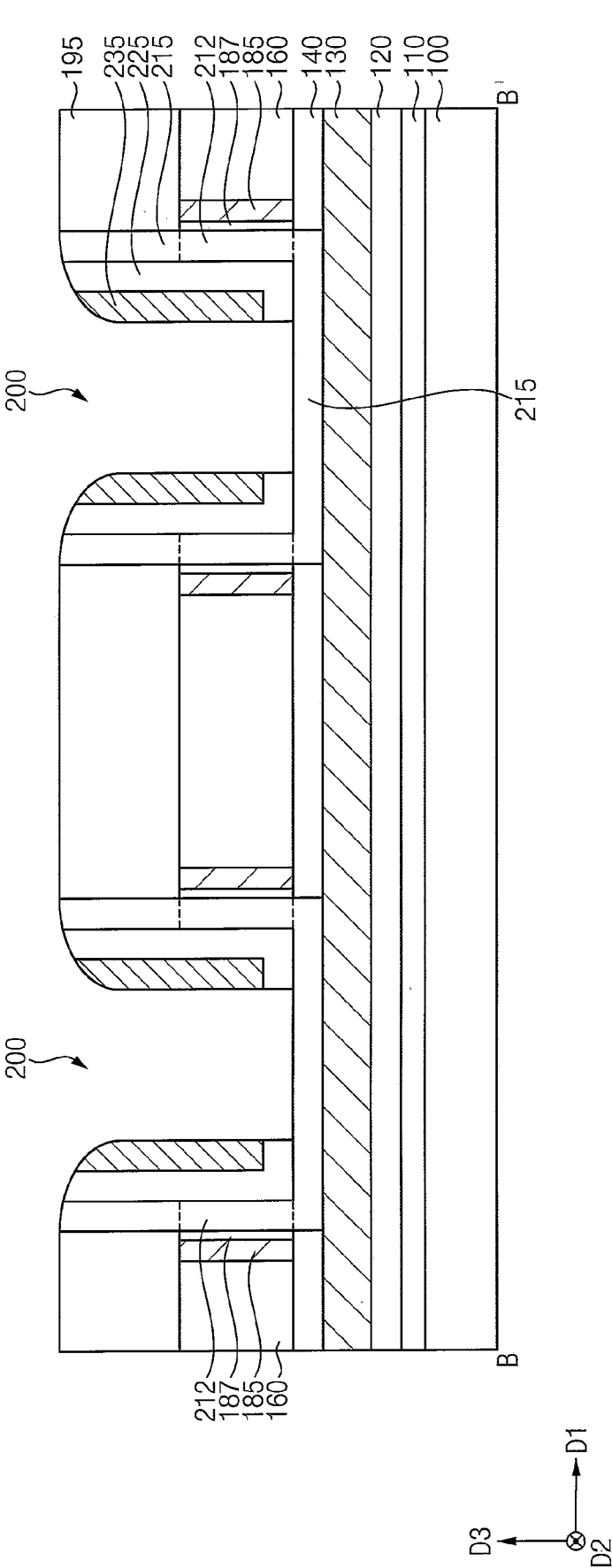

Referring to FIGS. 13 and 14, the gate electrode layer 230, the gate insulation layer 220 and the amorphous channel layer 210 may be anisotropically etched to form a gate electrode 235, a gate insulation pattern 225 and an amorphous channel 215, respectively.

The amorphous channel 215 and the crystalline channel 212 may form a channel structure. In example embodiments, the channel structure may extend in the second direction D2, and a plurality of channel structures may be spaced apart from each other in the first direction D1. An outer sidewall of the channel structure may contact sidewalls of neighboring ones of the first bar structures in the first direction D1 and the upper surfaces of the bit line 130 and the first insulating interlayer pattern 150. In example embodiments, a cross-section of the channel structure in the first direction D1 may have a cup shape.

An outer sidewall of the gate insulation pattern 225 may contact an inner sidewall of the channel structure and an upper surface of an edge portion in the first direction D1 of the channel structure. In example embodiments, a cross-section of the gate insulation pattern 225 in the first direction D1 may have an "L" shape.

An outer sidewall of the gate electrode 235 may contact an inner sidewall of the gate insulation pattern 225 and an upper surface of a portion of the gate insulation pattern 225 that is on the upper surface of the edge portion of the channel structure.

Figure 15:
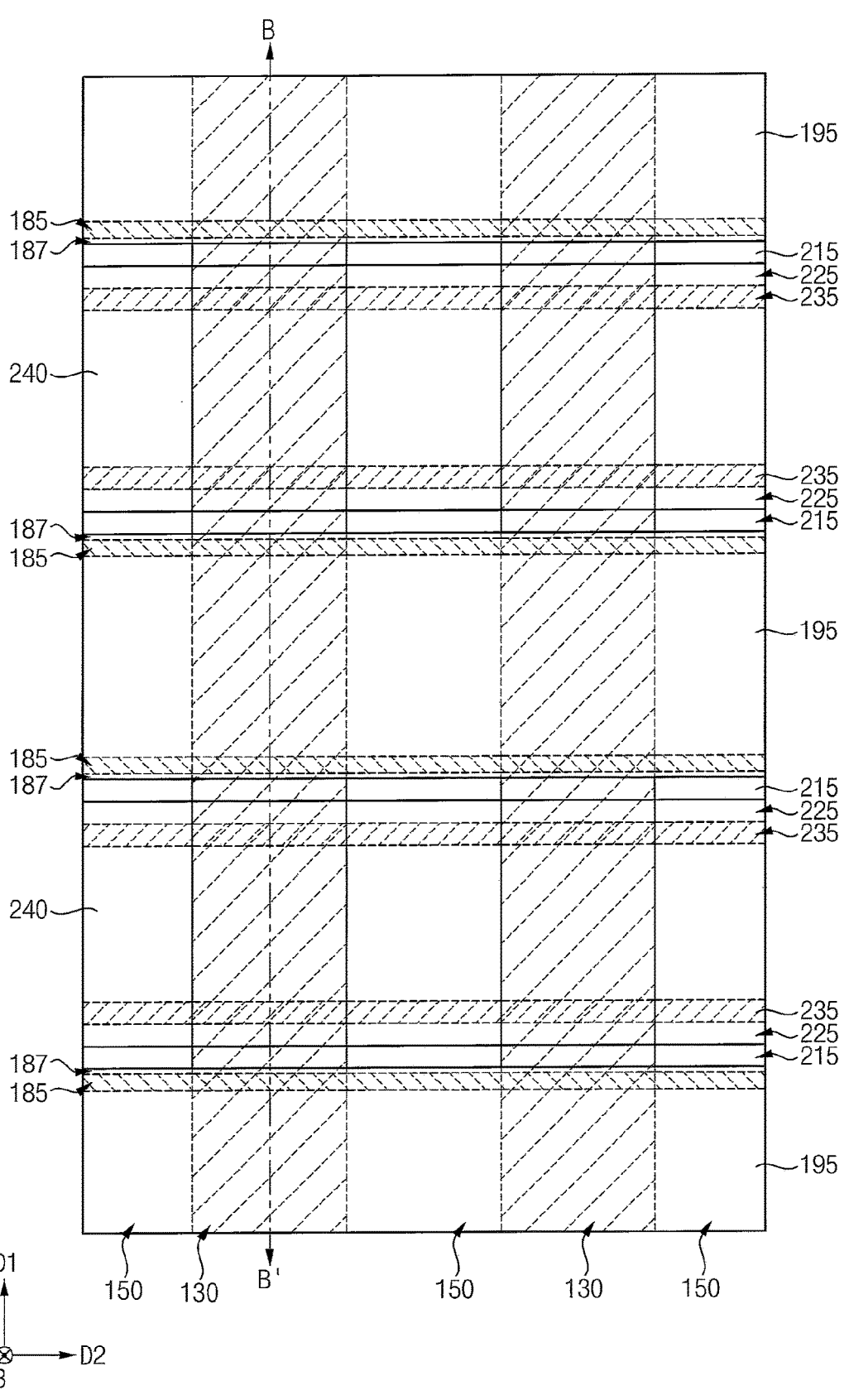
Figure 16:
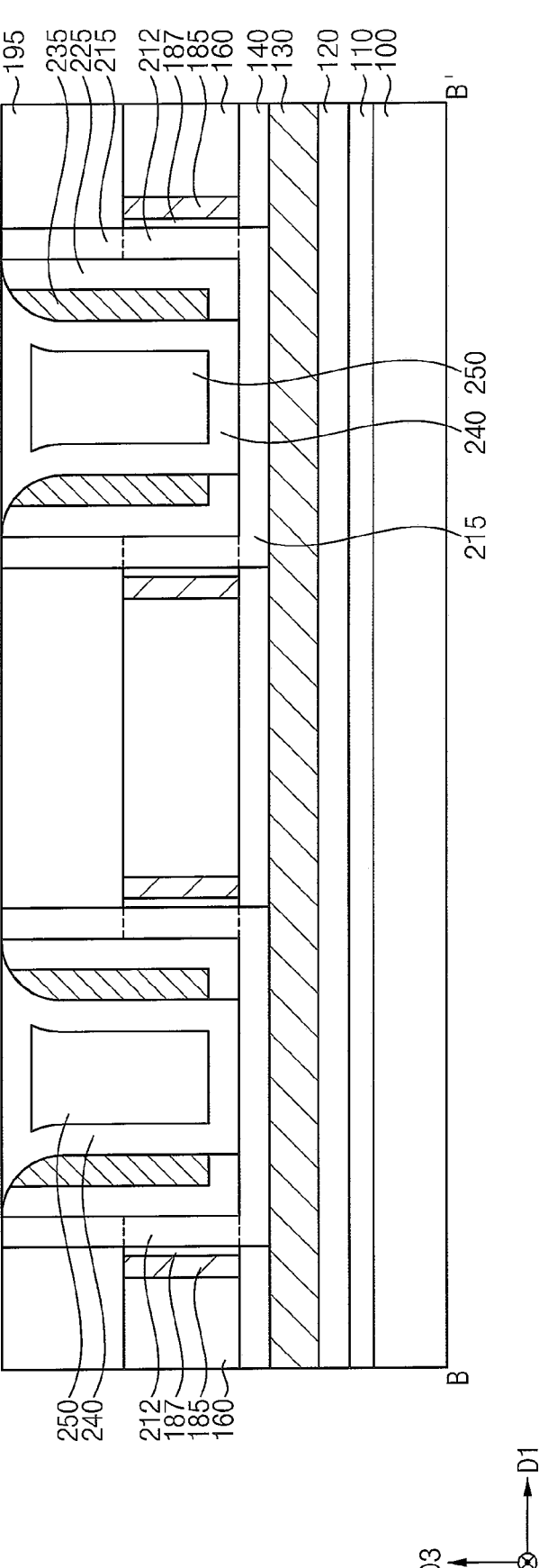

Referring to FIGS. 15 and 16, a fourth insulation layer may be formed on the channel structure, the gate insulation pattern 225, the gate electrode 235 and the third insulating interlayer pattern 195, a fourth insulating interlayer may be formed on the fourth insulation layer to fill a remaining portion of the third opening 200, and upper portions of the fourth insulating interlayer and the fourth insulation layer may be removed until an upper surface of the third insulating interlayer pattern 195 is exposed, by, e.g., a wet etching process or a dry etching process. Thus, the fourth insulating interlayer may remain in the third opening 200 as a fourth insulation pattern 250.

An additional fourth insulation layer may be formed on the fourth insulating interlayer pattern 250, the fourth insulation layer, the channel structure, the gate insulation pattern 225, the gate electrode 235 and the third insulating interlayer pattern 195, and may be planarized until the upper surface of the third insulating interlayer pattern 195 is exposed.

Thus, a fourth insulation pattern 240 may be formed in the third opening 200 to surround the fourth insulating interlayer pattern 250.

Figure 17:
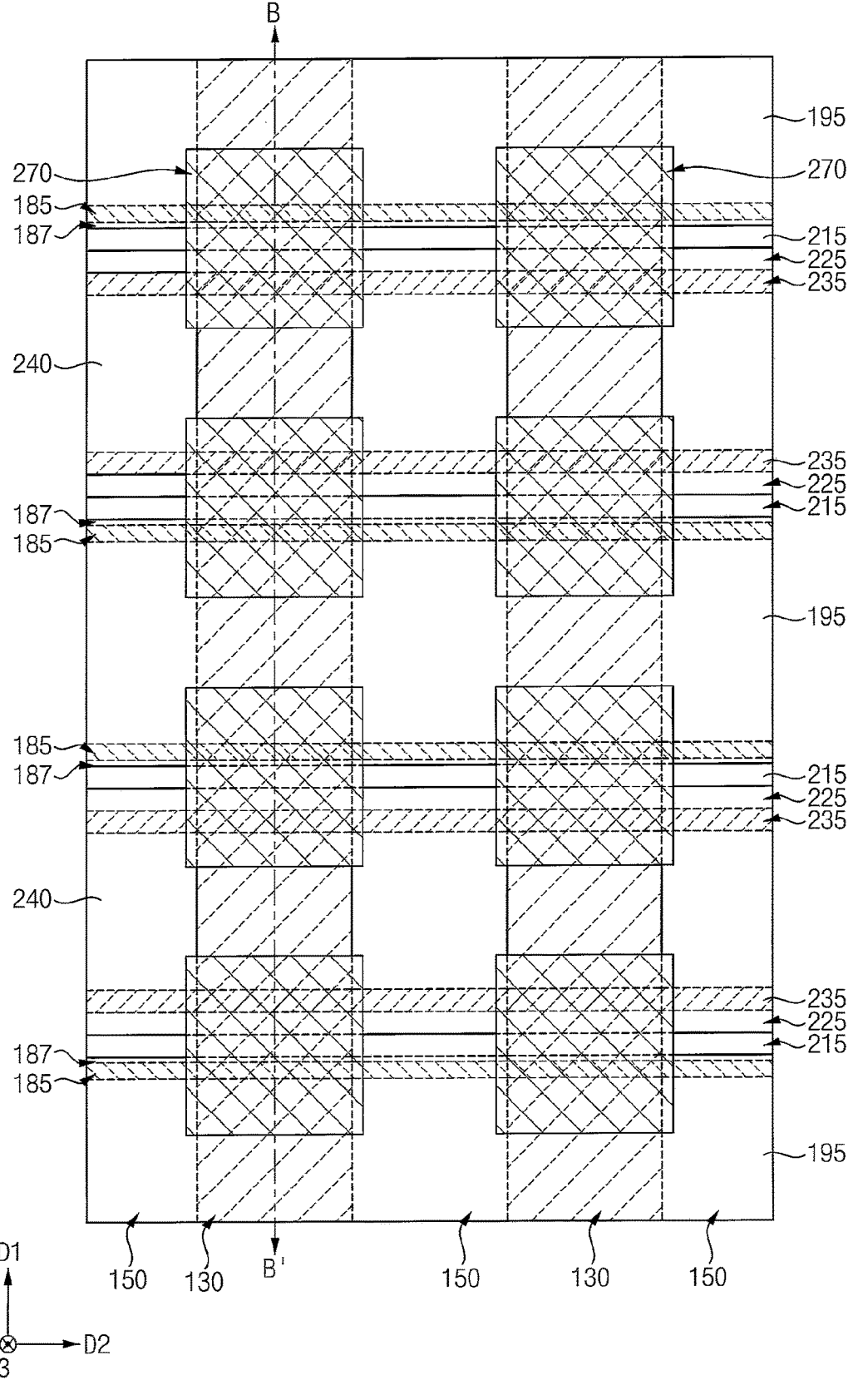
Figure 18:
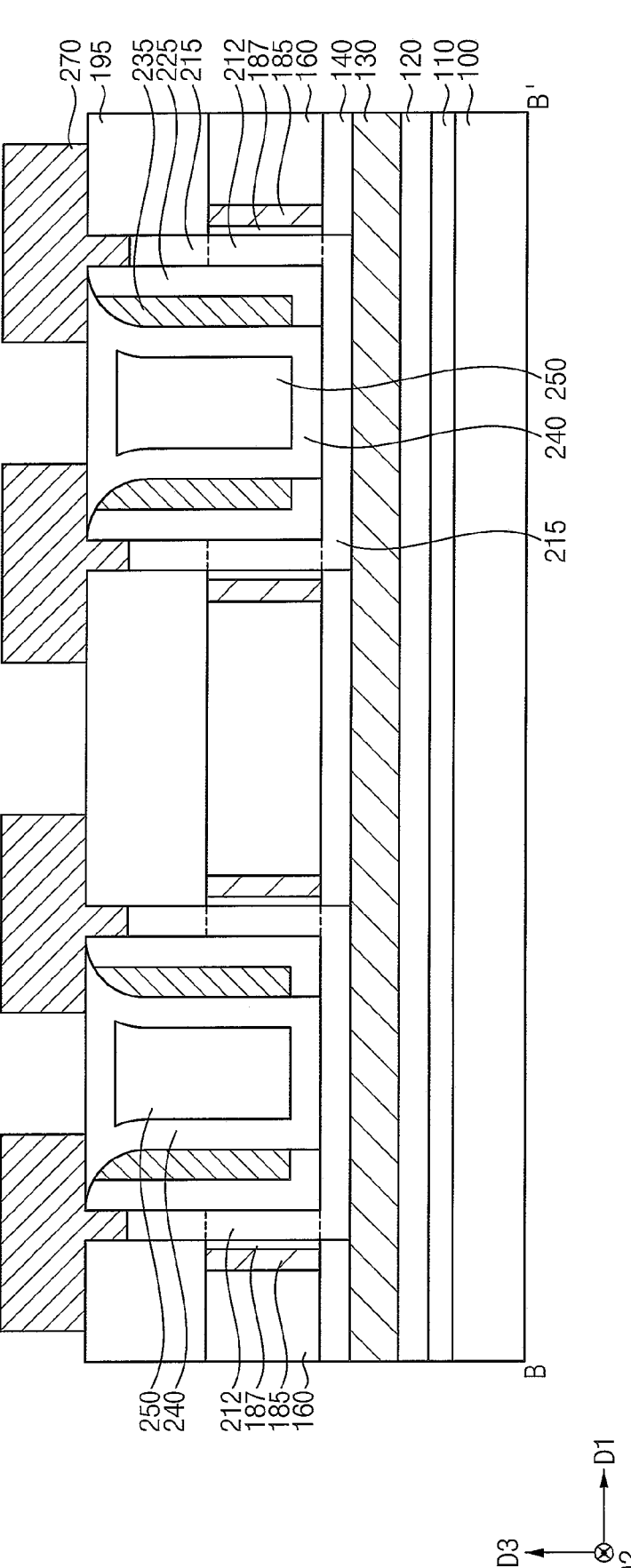

Referring to FIGS. 17 and 18, an upper portion the amorphous channel 215 may be partially removed by, e.g., a wet etching process to form a recess.

A contact plug layer may be formed on the fourth insulation pattern 240, the channel structure, the gate insulation pattern 225, the gate electrode 235 and the third insulating interlayer pattern 195 to fill the recess, and may be patterned to form a contact plug 270 contacting an upper surface of the amorphous channel 215. In example embodiments, a plurality of contact plugs 270 may be formed to be spaced apart from each other in the first and second directions D1 and D2.

In an example embodiment, the contact plugs 270 may be arranged in a lattice pattern in a plan view. Alternatively, the contact plugs 270 may be arranged in a honeycomb pattern in a plan view.

Referring to FIGS. 1 and 2 again, a fifth insulating interlayer may be formed on the fourth insulation pattern 240, the channel structure, the gate insulation pattern 225, the gate electrode 235 and the third insulating interlayer pattern 195 to cover the contact plug 270, and an upper portion of the fifth insulating interlayer may be planarized until an upper surface of the contact plug 270 is exposed to form a fifth insulating interlayer pattern 280 covering a sidewall of the contact plug 270.

A first capacitor electrode 290 may be formed to contact the upper surface of the contact plug 270, a dielectric layer 300 may be formed on an upper surface and a sidewall of the first capacitor electrode 290 and an upper surface of the fifth insulating interlayer pattern 280, and a second capacitor electrode 310 may be formed on the dielectric layer 300 to form a capacitor 320.

Thus, the fabrication of the semiconductor device may be completed.

As illustrated above, the first metal pattern 185 may be formed before forming the channel layer 210 including an amorphous oxide semiconductor material, and the channel layer 210 may be formed to partially contact the first metal pattern 185. The portion of the channel layer 210 adjacent to the first metal pattern 185 may be converted into the crystalline channel 212 including a crystalline oxide semiconductor material by the heat generated during the deposition process for forming the gate insulation layer 220 and the gate electrode layer 230 and the metal included in the first metal pattern 185, which may have the high electron affinity.

Additionally, the first metal pattern 185 may cure the oxygen vacancy of the channel layer 210, and thus the first metal oxide pattern 187 may be formed between the first metal pattern 185 and the crystalline channel 212, and the reliability of crystalline channel 212 may be enhanced.

Figure 19:
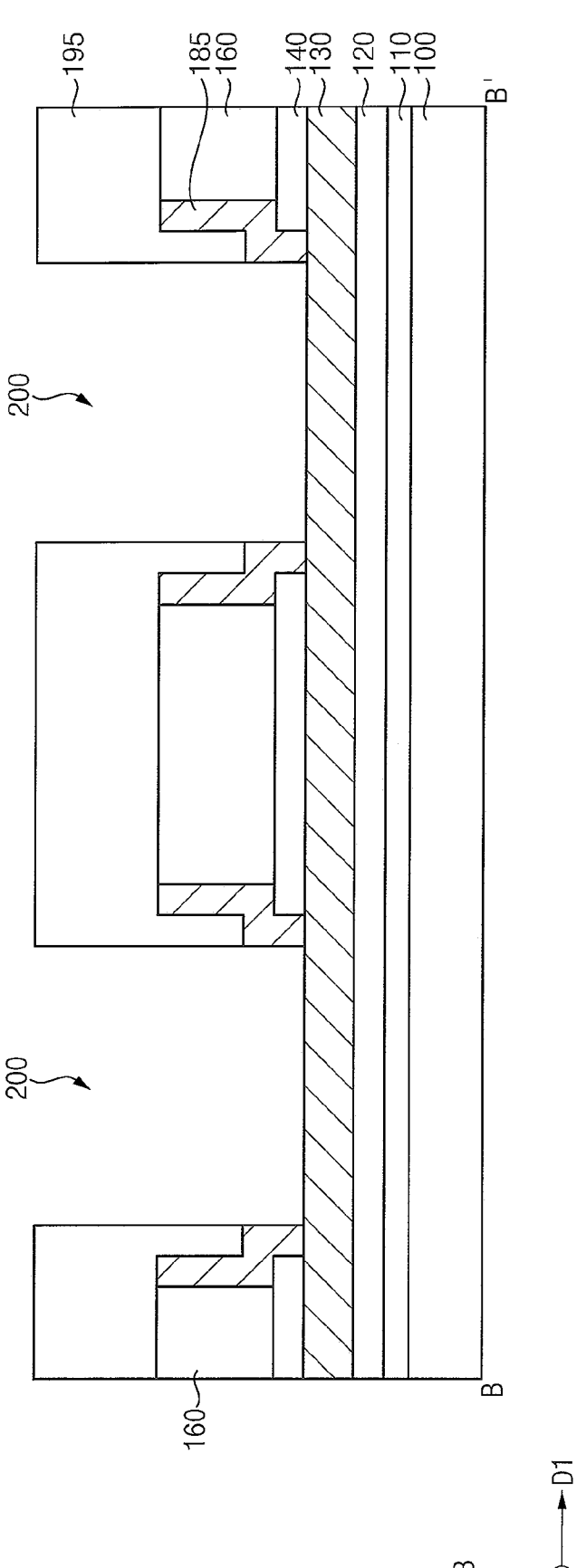
FIGS. 19 and 20 are cross-sectional views illustrating a method of manufacturing a semiconductor device in accordance with example embodiments.
Figure 20:
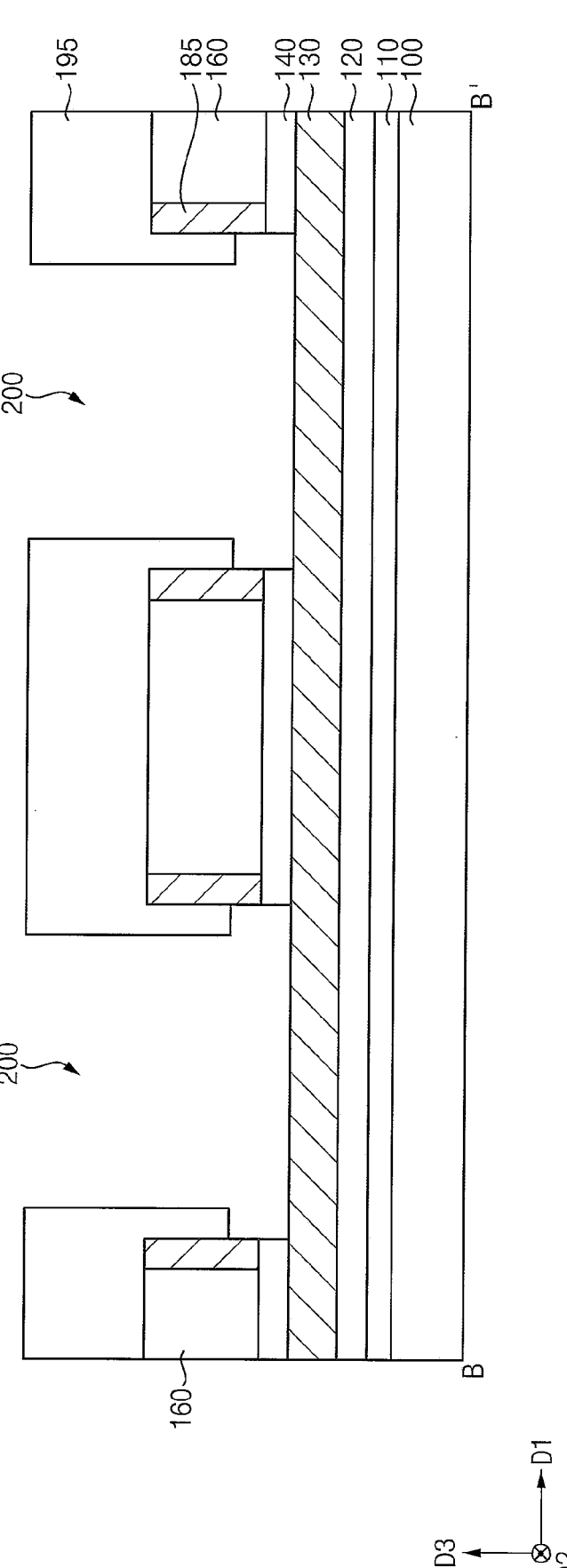

FIGS. 19 and 20 are cross-sectional views illustrating a method of manufacturing a semiconductor device in accordance with example embodiments, which are cross-sectional views taken along lines B-B' of corresponding plan views, respectively. This method may include processes substantially the same as or similar to those of FIGS. 3 to 19 and FIGS. 1 and 2, and thus repeated explanations are omitted herein.

Referring to FIG. 19, processes substantially the same as or similar to those illustrated with reference to FIGS. 3 to 11 may be performed.

However, when the portions of the third insulating interlayer pattern 195, the first metal pattern 185 and the third insulation pattern 140 are removed, the portion of the first metal pattern 185 on the upper surface and the sidewall of the third insulation pattern 140 may not be removed, and only the portion of the first metal pattern 185 on the upper surfaces of the bit line 130 and the first insulating interlayer pattern 150 may be removed, and an upper sidewall of the first metal pattern 185 may not be exposed.

Thus, only a lower portion of the first metal pattern 185 on the sidewall of the third insulation pattern 140 may be exposed by the third opening 200.

Referring to FIG. 20, a wet etching process may be performed using, e.g., hydrogen peroxide (H$_2$O$_2$) as an etching solution to remove the exposed portion of the first metal pattern 185.

A dry etching process may be further performed on the third insulating interlayer pattern 195 so that a sidewall of the first metal pattern 185 on the sidewall of the second insulating interlayer pattern 160 may be exposed. In example embodiments, the dry etching process may be performed using an etching gas having an etching selectivity between a metal included in the first metal pattern 185 and silicon oxide included in the second insulating interlayer pattern 160, e.g., NF$_3$ and NH$_3$, and thus a portion of the third insulating interlayer pattern 195 on an upper sidewall of the first metal pattern 185 may be removed while the first metal pattern 185 is not removed.

Thus, as in FIGS. 10 and 11, the third opening 200 and the first metal pattern 185 may be formed.

Processes substantially the same as or similar to those illustrated with reference to FIGS. 12 to 18 and FIGS. 1 and 2 may be performed to complete the fabrication of the semiconductor device.

In the method of manufacturing the semiconductor device, a portion of the third insulating interlayer pattern 195 and a portion of the first metal pattern 185 on the upper surface of the bit line 130 may be removed by a dry etching process, a portion of the first metal pattern 185 on the sidewall of the third insulation pattern 140 may be removed by a wet etching process, and an additional dry etching process may be performed to remove a portion of the third insulating interlayer pattern 195 so as to expose the portion of the first metal pattern 185 on the sidewall of the third insulation pattern 140.

The additional dry etching process may be performed to remove only the third insulating interlayer pattern 195 without removing the first metal pattern 185, and thus the etching gas having a high etching selectivity between the first metal pattern 185 and the third insulating interlayer pattern 195 may be used.

When the third insulating interlayer pattern 195 and the first metal pattern 185 are etched by the same dry etching process to expose the upper sidewall of the first metal pattern 185, if misalignment occurs, the sidewall of the first metal pattern 185 may be partially removed by the dry etching process. However, in this method, the sidewall of the first metal pattern 185 may not be partially removed by the dry etching processes.

Figure 21:
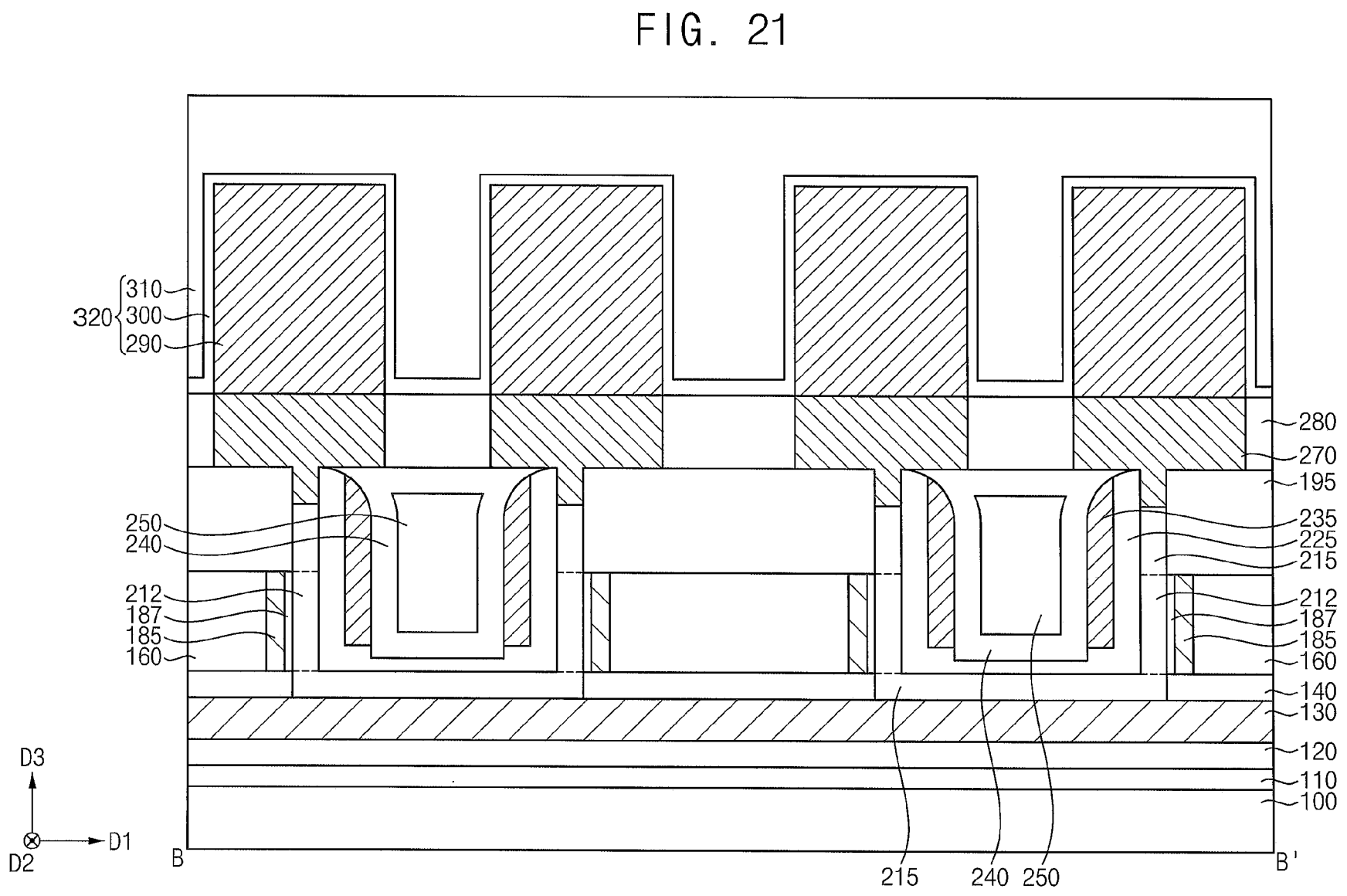

FIG. 21 is a cross-sectional view illustrating a semiconductor device in accordance with example embodiments, which may correspond to FIG. 2. This semiconductor device may be substantially the same as or similar to that of FIGS.

1 and 2, except for the gate insulation pattern, and thus repeated explanations are omitted herein.

Referring to FIG. 21, the gate insulation pattern 225 may also be formed on the upper surface of the amorphous channel 215, and a cross-section of the gate insulation pattern 225 in the first direction D1 may have a cup shape instead of an "L" shape.

For example, the gate insulation pattern 225 shown in FIGS. 1 and 2 may be formed at each of opposite sides of the fourth insulation pattern 240 in the first direction D1, while the gate insulation patterns 225 at opposite sides of the fourth insulation pattern 240 in the first direction D1, respectively, are not spaced apart from each other, but may be connected with each other under the fourth insulation pattern 240 in FIG. 21.

Figure 22:
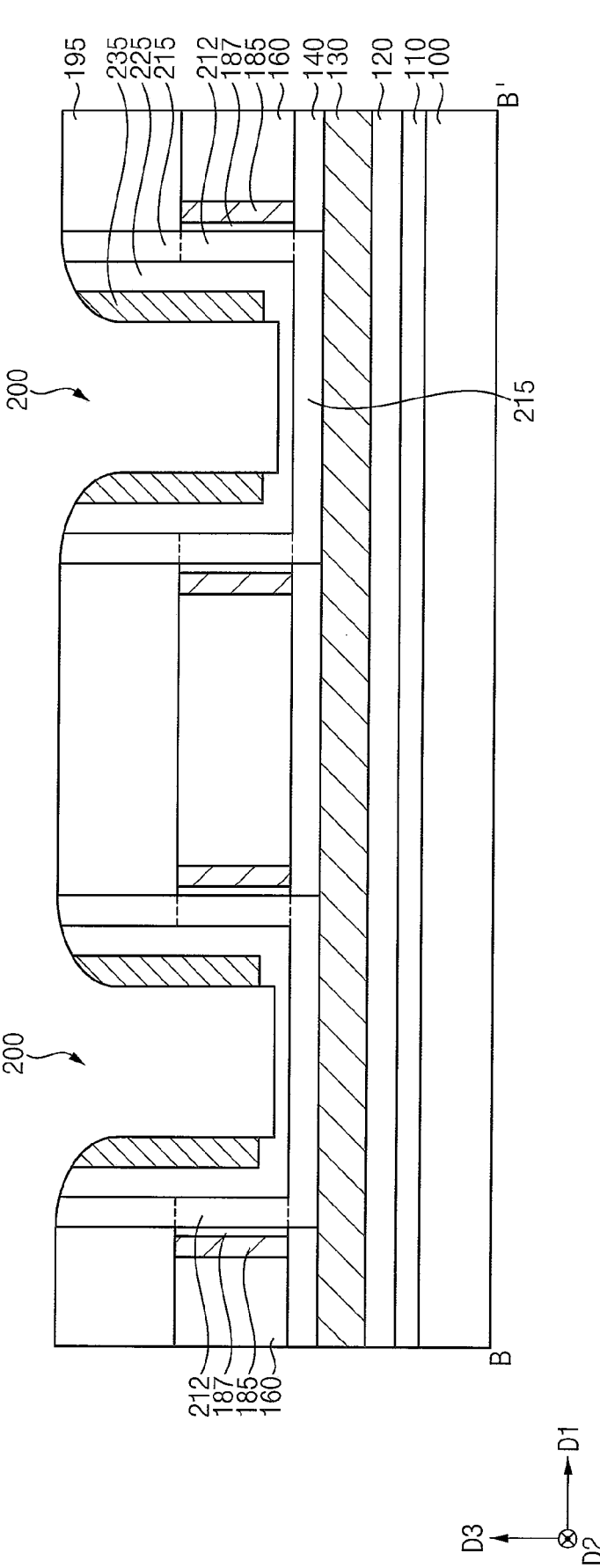
FIG. 22 is a cross-sectional view illustrating a method of manufacturing a semiconductor device in accordance with example embodiments.

FIG. 22 is a cross-sectional view illustrating a method of manufacturing a semiconductor device in accordance with example embodiments, which may correspond to FIG. 14. This method may include processes substantially the same as or similar to those of FIGS. 3 to 18 and FIGS. 1 and 2, and thus repeated explanations are omitted herein.

Referring to FIG. 22, processes substantially the same as or similar to those illustrated with reference to FIGS. 3 to 12 may be performed, and processes substantially the same as or similar to those illustrated with reference to FIGS. 13 and 14 may be performed.

However, the gate insulation pattern 225 that may be formed by an anisotropic etching process on the gate insulation layer 220 may also be formed on the upper surface of the amorphous channel 215 in addition to the opposite sidewalls of the third opening 200.

For example, during the anisotropic etching process, a portion of the gate insulation layer 220 on the channel layer 210 may not be removed but remain, and thus a cross-section of the gate insulation pattern 225 in the first direction D1 may have a cup shape instead of an "L" shape.

Processes substantially the same as or similar to those illustrated with reference to FIGS. 15 to 18 and FIGS. 1 and 2 may be performed to complete the fabrication of the semiconductor device.

Figure 23:
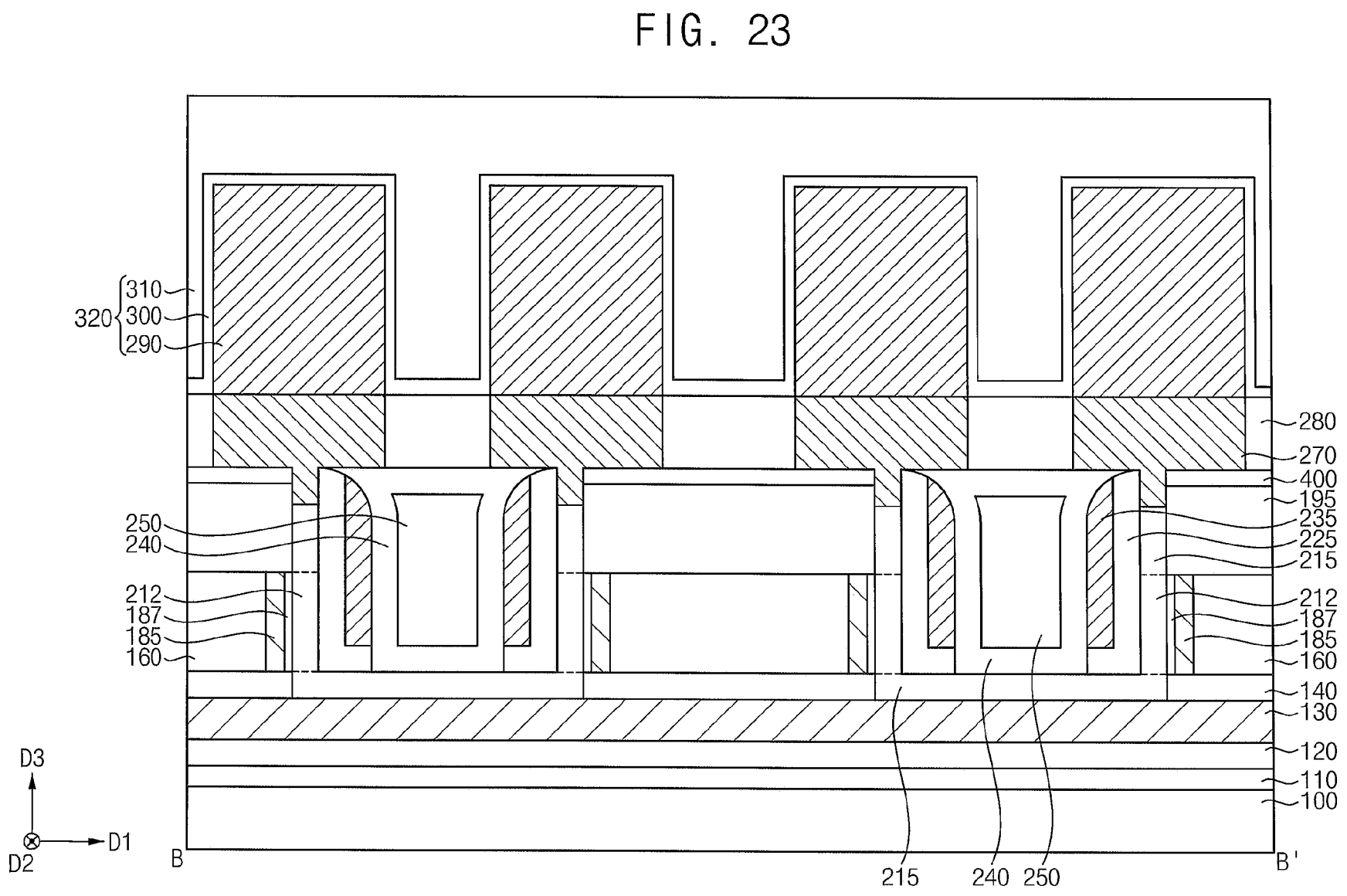

FIG. 23 is a cross-sectional view illustrating a semiconductor device in accordance with example embodiments, which may correspond to FIG. 2. This semiconductor device may be substantially the same as or similar to that of FIGS. 1 and 2, except for further comprising a first etch stop pattern, and thus repeated explanations are omitted herein.

Referring to FIG. 23, the semiconductor device may include a first etch stop pattern 400 on the third insulating interlayer pattern 195, the first metal pattern 185, the second insulating interlayer pattern 160 and the third insulation pattern 140, which may collectively form a second bar structure extending in the second direction D2.

Figure 24:
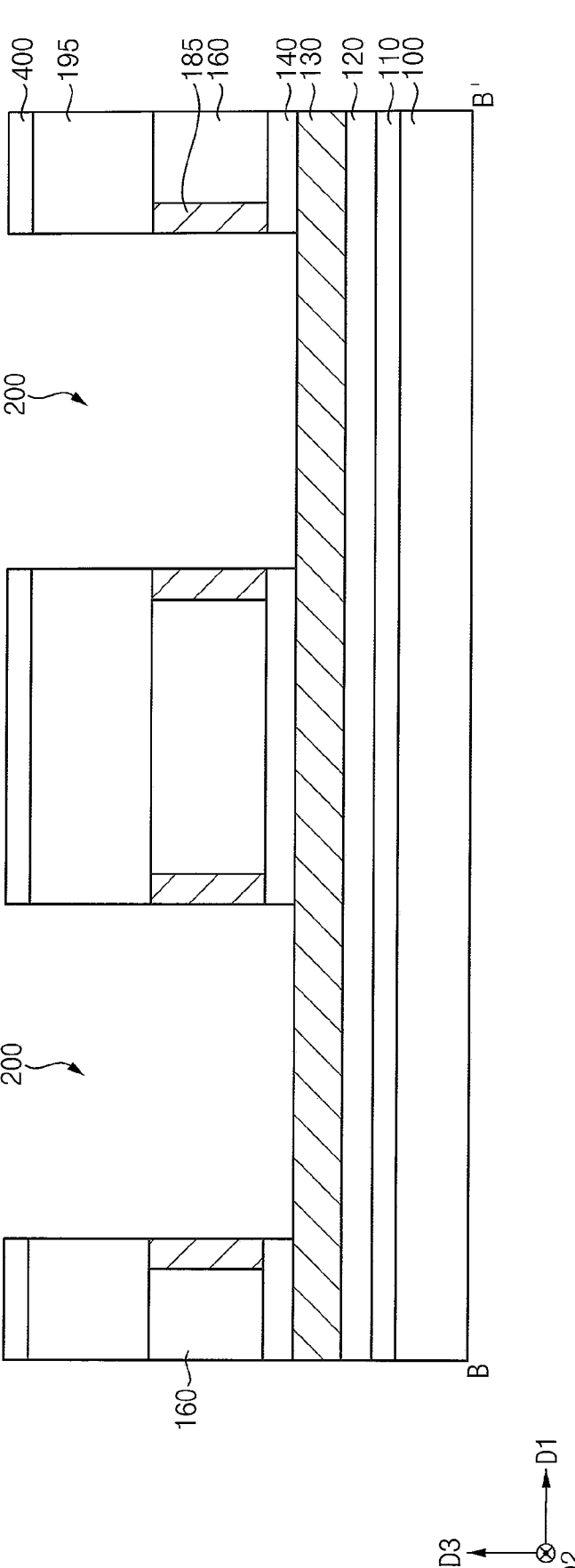
FIG. 24 is a cross-sectional view illustrating a method of manufacturing a semiconductor device in accordance with example embodiments.

FIG. 24 is a cross-sectional view illustrating a method of manufacturing a semiconductor device in accordance with example embodiments, which may correspond to FIG. 11. This method may include processes substantially the same as or similar to those of FIGS. 3 to 18 and FIGS. 1 and 2, and thus repeated explanations are omitted herein.

Referring to FIG. 24, processes substantially the same as or similar to those illustrated with reference to FIGS. 3 to 11 may be performed.

However, after forming the third insulating interlayer 190 on the third insulating interlayer patterns 195 and the first metal patterns 185 again, a first etch stop layer may be further formed on the third insulating interlayer 190.

For example, a dry etching process may be performed to remove portions of the first etch stop layer, the third insulating interlayer pattern 195, the first metal pattern 185 and the third insulation pattern 140 so that the third opening 200 may be formed.

By the dry etching process, the first etch stop layer may be transformed into a first etch stop pattern 400, and the third insulating interlayer pattern 195, the first metal pattern 185, the second insulating interlayer pattern 160 and the third insulation pattern 140 may be formed under the first etch stop pattern 400, which may collectively form a second bar structure.

Processes substantially the same as or similar to those illustrated with reference to FIGS. 12 to 18 and FIGS. 1 and 2 may be performed to complete the fabrication of the semiconductor device.

In this method, as the first etch stop layer is formed on the third insulating interlayer 190, during the formation of the third opening 200, the third insulating interlayer 190 may not be removed, and thus a portion of the third insulating interlayer pattern 195 on the first metal pattern 185 may have a sufficiently large thickness in the third direction D3.

Figure 25:
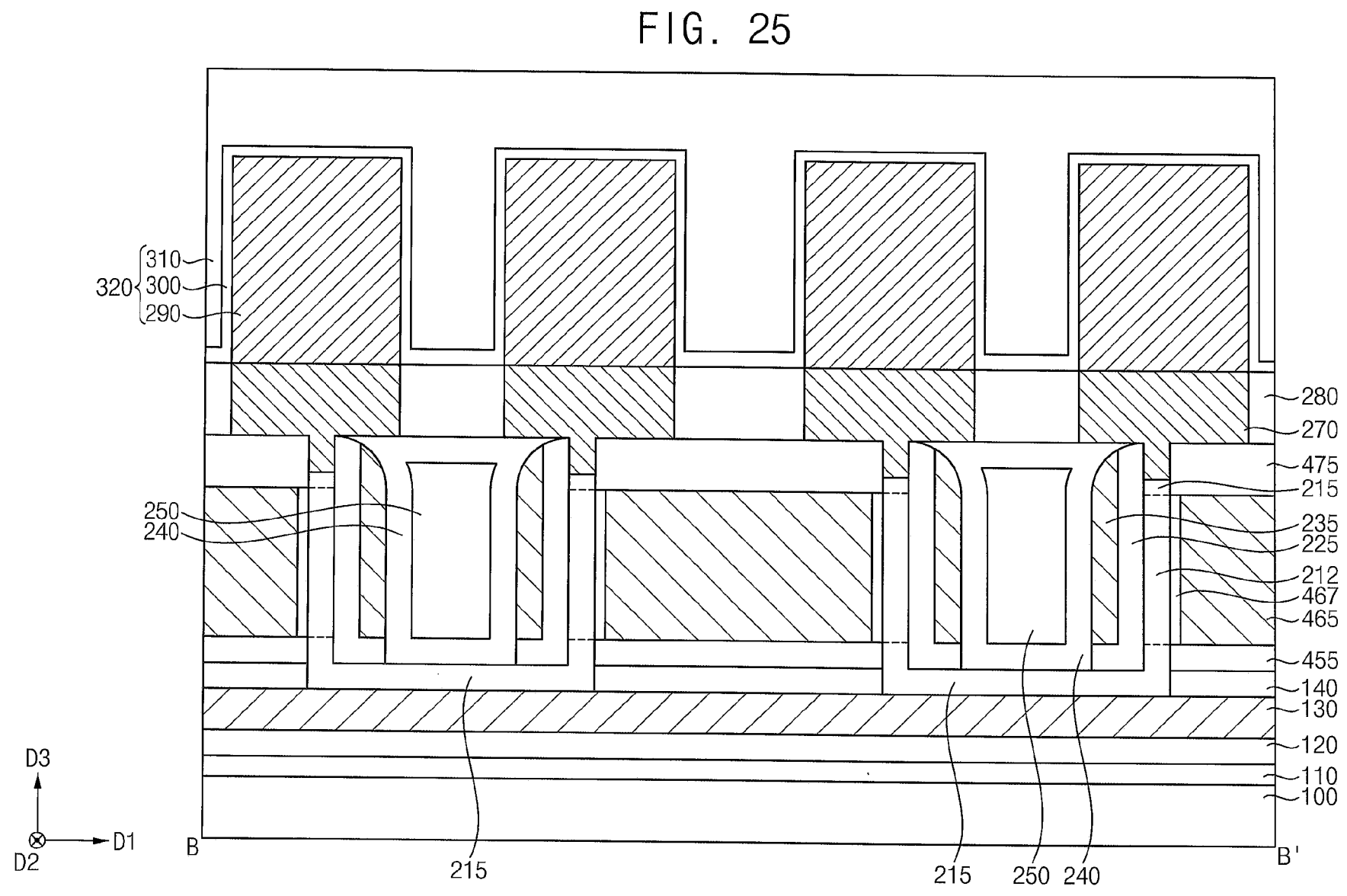

FIG. 25 is a cross-sectional view illustrating a semiconductor device in accordance with example embodiments, which may correspond to FIG. 2. This semiconductor device may be substantially the same as or similar to that of FIGS. 1 and 2, except for including a second metal pattern instead of the first metal pattern, and thus repeated explanations are omitted herein.

Referring to FIG. 25, a third bar structure including the third insulation pattern 140, a sixth insulation pattern 455, a second metal pattern 465 and a seventh insulation pattern 475 sequentially stacked and extending in the second direction D2 may be formed on the bit line 130 and the first insulating interlayer pattern 150.

In example embodiments, the second metal pattern 465 may extend in the second direction D2, and second metal oxide patterns 467 may be formed at opposite sides, respectively, of the second metal pattern 465 in the first direction D1. The second metal pattern 465 and the second metal oxide patterns 467 may be formed between and contact neighboring ones of the crystalline channels 212.

For example, in the semiconductor device shown in FIGS. 1 and 2, the first metal pattern 185 and the first metal oxide pattern 187 may be formed on the outer sidewall of the crystalline channel 212, and not only the first metal pattern 185 and the first metal oxide pattern 187 but also the second insulating interlayer pattern 160 may be formed between neighboring ones of the crystalline channels 212 in the first direction D1. Particularly, the second insulating interlayer pattern 160 may be formed between neighboring ones of the crystalline channels 212 in the first direction D1, and the first metal pattern 185 and the first metal oxide pattern 187 may be formed on each of opposite sides of the second insulating interlayer pattern 160 in the first direction D1.

However, in the semiconductor device shown in FIG. 25, the second insulating interlayer pattern 160 may not be formed between neighboring ones of the crystalline channels 212 in the first direction D1, and only the first metal pattern 185 and the first metal oxide pattern 187 may be formed to contact the crystalline channels 212.

The sixth and seventh insulation patterns 455 and 475 may include an oxide, e.g., silicon oxide.

FIGS. 26 to 29 are cross-sectional views illustrating a method of manufacturing a semiconductor device in accordance with example embodiments. This method may include processes substantially the same as or similar to those of FIGS. 3 to 18 and FIGS. 1 and 2, and thus repeated explanations are omitted herein.

Referring to FIG. 26, the first insulation layer 110, the bit line structure and the first insulating interlayer pattern 150 may be formed on the substrate 100, and a sixth insulation layer 450, a second metal layer 460 and a seventh insulation layer 470 may be formed on the first insulating interlayer pattern 150.

Figure 27:
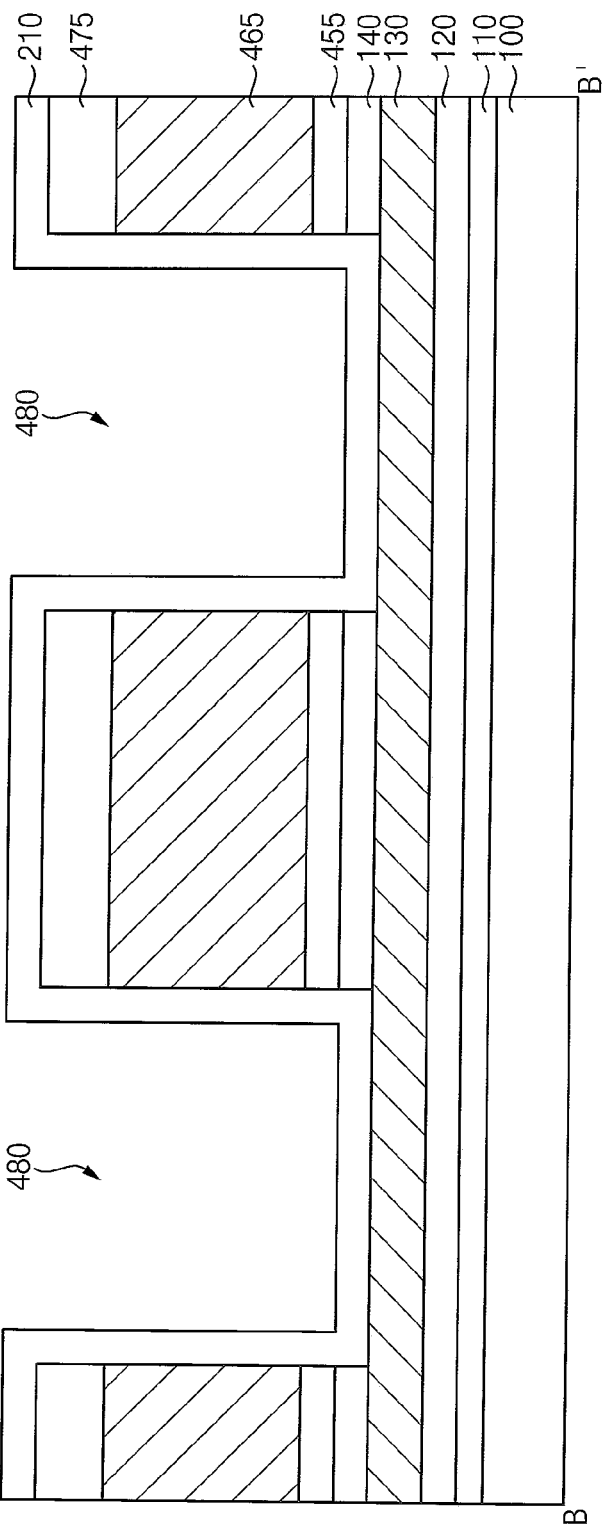
Figure 27:
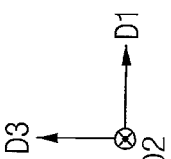

Referring to FIG. 27, the seventh insulation layer 470, the second metal layer 460 and the sixth insulation layer 450 may be patterned to form seventh insulation patterns 475, second metal patterns 465 and sixth insulation patterns 455, respectively, and the third insulation pattern 140 may be divided into a plurality of parts spaced apart from each other in the first direction D1.

The third insulation pattern 140, the sixth insulation pattern 455, the second metal pattern 465 and the seventh insulation pattern 475 sequentially stacked on the bit line 130 and the first insulating interlayer pattern 150 may form a third bar structure extending in the second direction D2, and a plurality of third bar structures may be spaced apart from each other in the first direction D1. A fourth opening 480 exposing the upper surfaces of the bit line 130 and the first insulating interlayer pattern 150 may be formed to extend in the second direction D2 between neighboring ones of the third bar structures in the first direction D1.

The channel layer 210 may be formed on the exposed upper surfaces of the bit line 130 and the first insulating interlayer pattern 150 and a sidewall and an upper surface of the third bar structure. In example embodiments, the channel layer 210 may be formed by a deposition process, e.g., an ALD process, a CVD process, etc.

Figure 28:
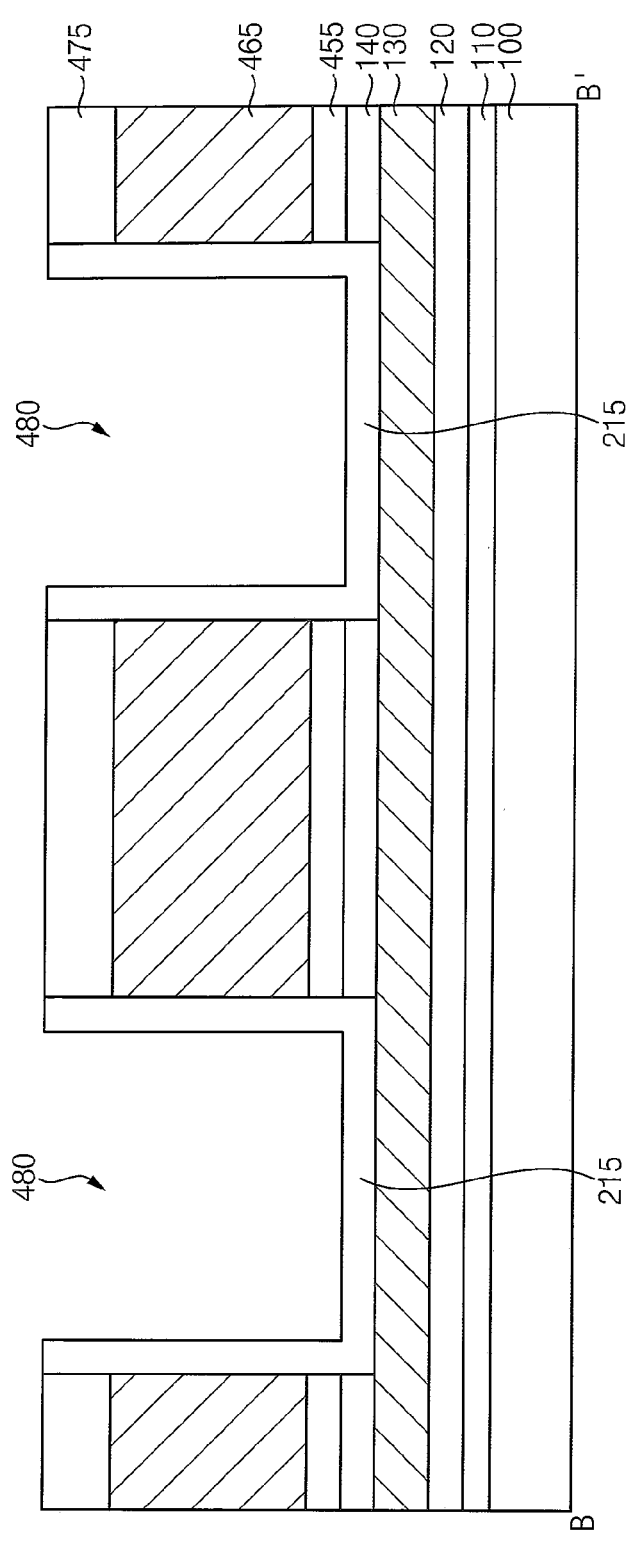
Figure 28:
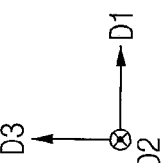

Referring to FIG. 28, a portion of the channel layer 210 on the third bar structure may be removed to form the amorphous channel 215 on the upper surfaces of the bit line 130 and the first insulating interlayer pattern 150 and the sidewall of the third bar structure.

The amorphous channel 215 may extend in the second direction D2, and a plurality of amorphous channels 215 may be spaced apart from each other in the first direction D1.

In example embodiments, a sacrificial layer may be formed on the channel layer 210 to fill the fourth opening 480, an etching mask may be formed on the sacrificial layer, and a dry etching process may be performed using the etching mask to remove a portion of the channel layer 210 on the upper surface of the third bar structure. The sacrificial layer may include, e.g., spin-on-hardmask (SOH), amorphous carbon layer (ACL), etc., and after forming the amorphous channel 215, may be removed by, e.g., an ashing process and/or a stripping process.

Figure 29:
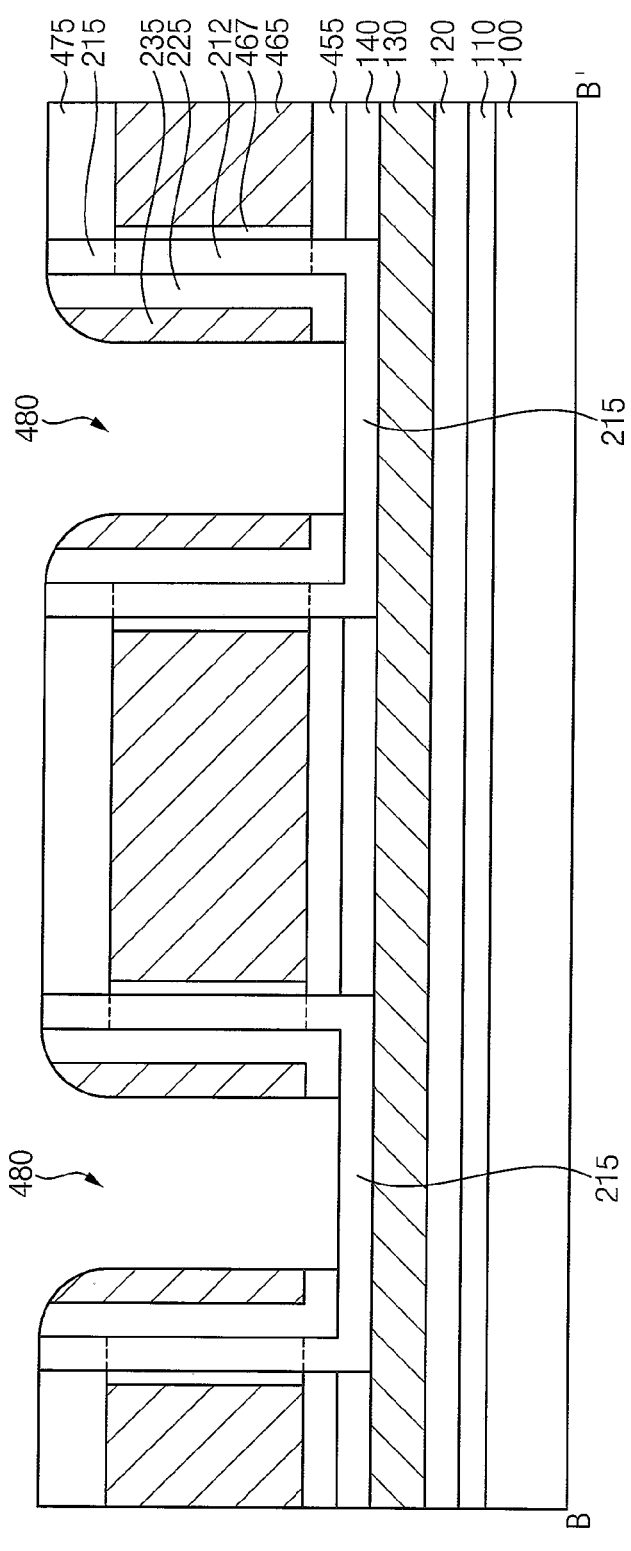
Figure 29:
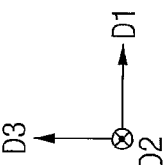

Referring to FIG. 29, the gate insulation layer 220 and the gate electrode layer 230 may be formed on the amorphous channel 215 and the third bar structure, and may be anisotropically etched to form the gate insulation pattern 225 and the gate electrode 235, respectively.

A portion of the amorphous channel 215 adjacent to the second metal pattern 465 may be converted into the crystalline channel 212, and a sidewall of the second metal pattern 465 adjacent to the crystalline channel 212 may be converted into a second metal oxide pattern 467.

Referring to FIG. 25 again, processes substantially the same as or similar to those illustrated with reference to FIGS. 15 to 18 and FIGS. 1 and 2 may be performed to complete the fabrication of the semiconductor device.

Figure 30:
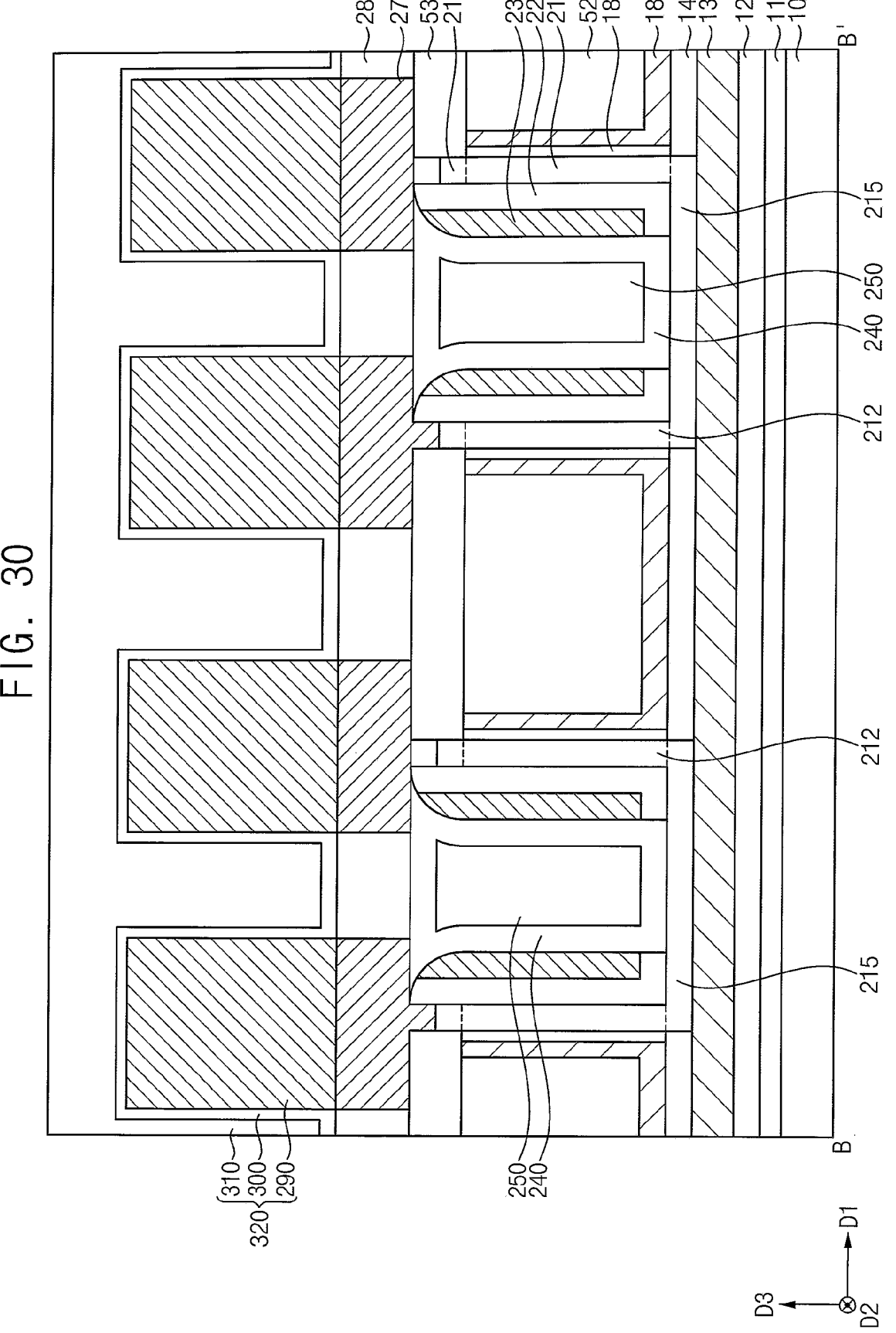
FIG. 30 is a cross-sectional view illustrating a semiconductor device in accordance with example embodiments.

FIG. 30 is a cross-sectional view illustrating a semiconductor device in accordance with example embodiments, which may correspond to FIG. 2. This semiconductor device may be substantially the same as or similar to that of FIGS. 1 and 2, except for including a third metal pattern instead of the first metal pattern and further including a second etch stop pattern, and thus repeated explanations are omitted herein.

Referring to FIG. 30, the third insulation pattern 140, a third metal pattern 186, the sixth insulation pattern 520 and a second etch stop pattern 535 may collectively form a fourth bar structure extending in the second direction D2, and a plurality of fourth bar structures may be spaced apart from each other in the first direction D1.

The channel structure, the gate insulation pattern 225, the gate electrode 235, the fourth insulation pattern 240 and the fourth insulating interlayer pattern 250 may be formed between neighboring ones of the fourth bar structures in the first direction D1.

In example embodiments, the third metal pattern 186 may be formed on the third insulation pattern 140, and a cross-section of the third metal pattern 186 in the first direction D1 may have a cup shape. The third metal pattern 186 may cover a sidewall and a lower surface of the sixth insulating interlayer 520. A third metal oxide pattern 188 may be formed on a portion of the third metal pattern 186 adjacent to the crystalline channel 212.

The second etch stop pattern 535 may be formed on the sixth insulating interlayer pattern 520, the third metal pattern 186 and the third metal oxide pattern 188, and may extend in the second direction D2. Thus, a lower surface of the second etch stop pattern 535 may contact upper surfaces of the third metal pattern 186 and the third metal oxide pattern 188.

The sixth insulating interlayer pattern 520 may include an oxide, e.g., silicon oxide, and the second etch stop pattern 535 may include, e.g., silicon oxide, silicon oxynitride, silicon oxycarbonitride, silicon oxycarbide, etc.

Figure 31:
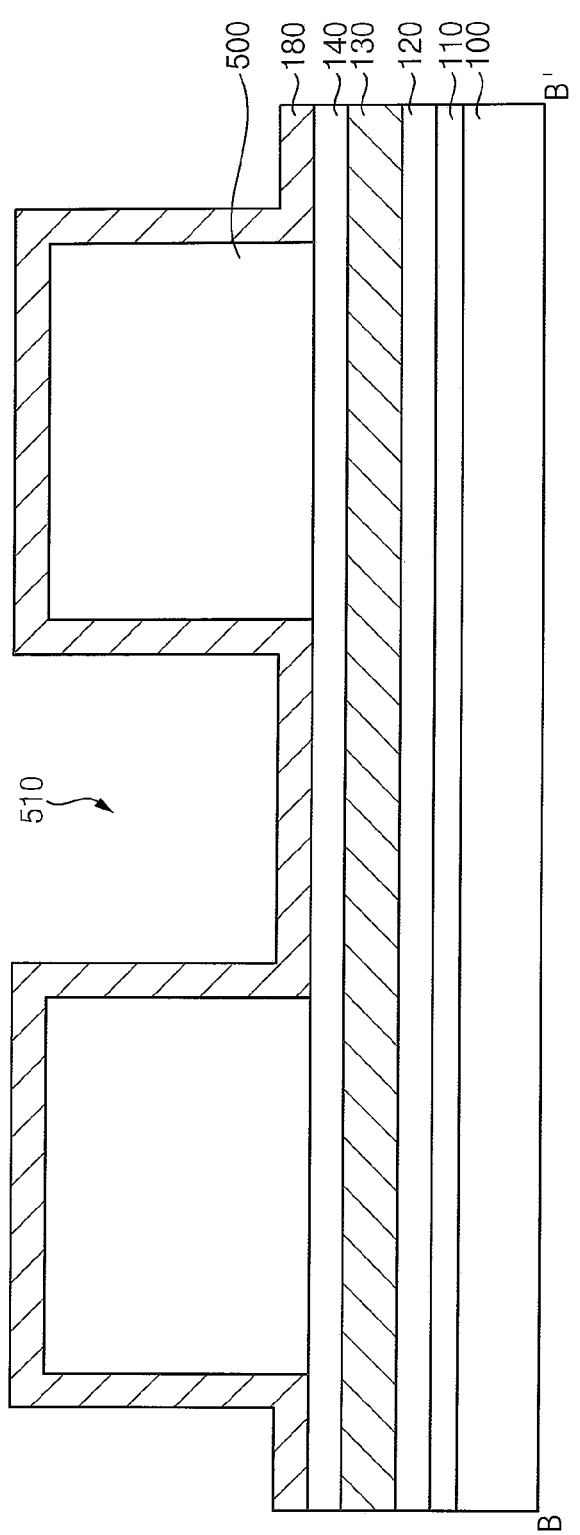
FIGS. 31 to 33 are cross-sectional views illustrating a method of manufacturing a semiconductor device in accordance with example embodiments.
Figure 31:
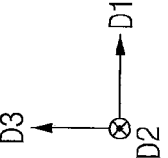
Figure 32:
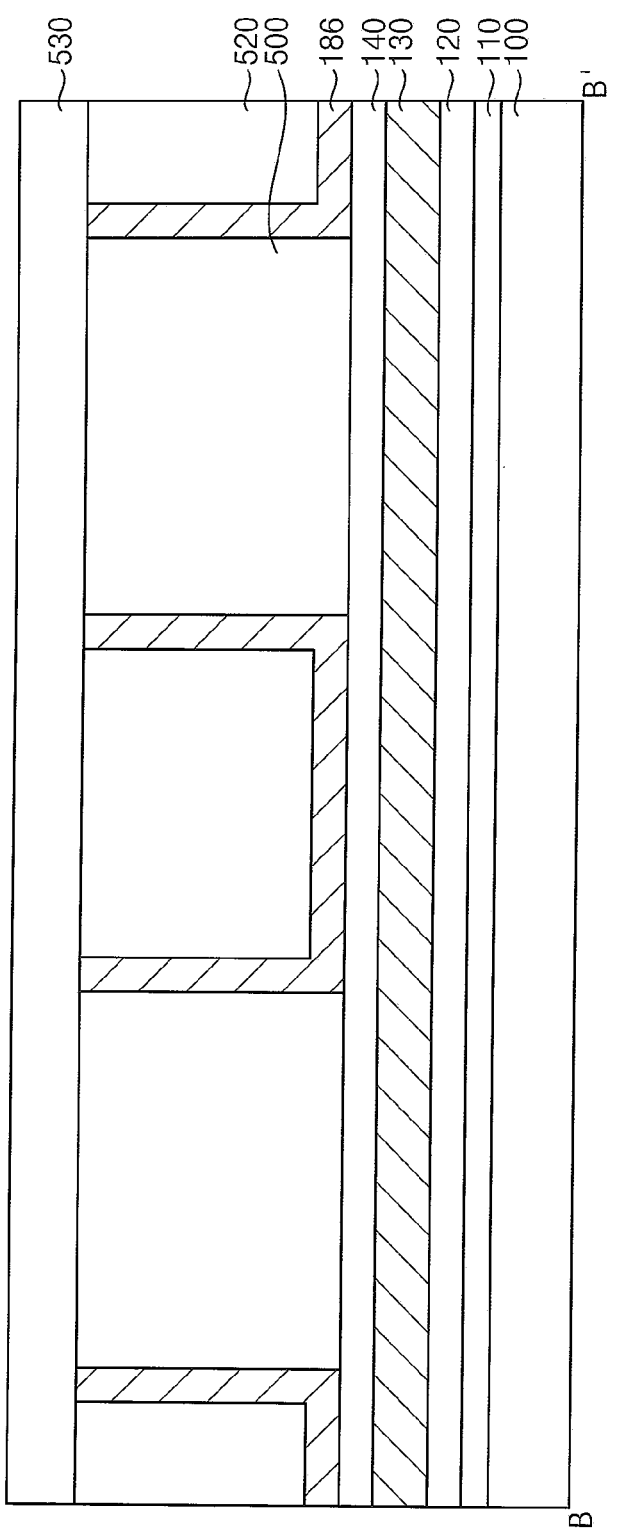
Figure 32:
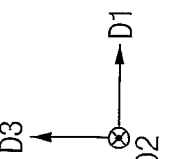
Figure 33:
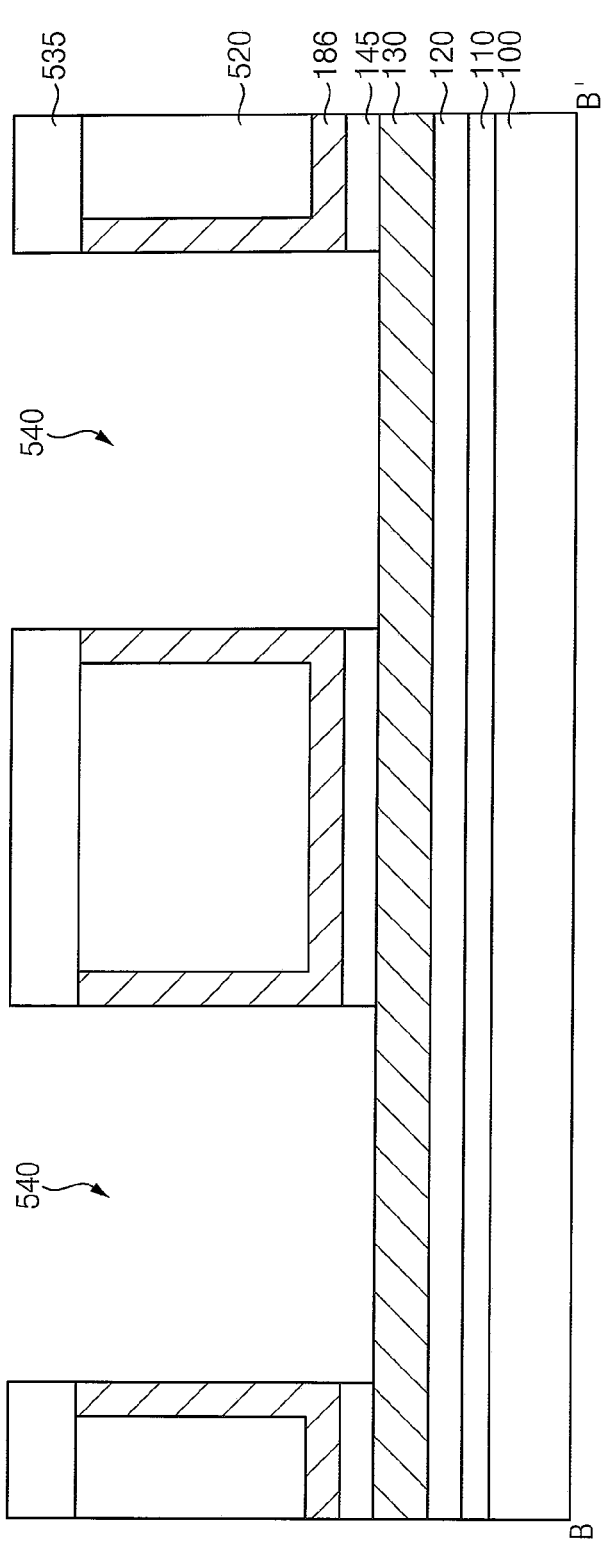
Figure 33:
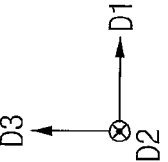

FIGS. 31 to 33 are cross-sectional views illustrating a method of manufacturing a semiconductor device in accordance with example embodiments. This method may include processes substantially the same as or similar to those of FIGS. 3 to 18 and FIGS. 1 and 2, and thus repeated explanations are omitted herein.

Referring to FIG. 31, processes substantially the same as or similar to those illustrated with reference to FIGS. 3 and 4 may be performed, and a sacrificial pattern 500 may be formed on the bit line structure and the first insulating interlayer pattern 150.

The sacrificial pattern 500 may extend in the second direction D2, and a plurality of sacrificial patterns 500 may be spaced apart from each other in the first direction D1. A fifth opening exposing the upper surfaces of the bit line structure and the first insulating interlayer pattern 150 may be formed between neighboring ones of the sacrificial patterns 500 in the first direction D1.

The first metal layer 180 may be formed on the upper surfaces of the bit line structure and the first insulating interlayer pattern 150 exposed by the fifth opening 510 and a sidewall and an upper surface of the sacrificial pattern 500.

Referring to FIG. 32, a sixth insulating interlayer may be formed on the first metal layer 180 to fill the fifth opening 510, and the sixth insulating interlayer and the first metal layer 180 may be planarized until an upper surface of the sacrificial pattern 500 is exposed.

Thus, the first metal layer 180 may be divided into a plurality of third metal patterns 186 each of which may extend in the second direction D2, and the sixth insulating interlayer may be divided into a plurality of sixth insulating interlayer patterns 520.

In example embodiments, a cross-section of the third metal pattern 186 in the first direction D1 may have a cup shape, and the sixth insulating interlayer pattern 520 may cover a sidewall and a lower surface of the sixth insulating interlayer pattern 520.

A second etch stop layer 530 may be formed on the sacrificial pattern 500, the sixth insulating interlayer pattern 520 and the third metal pattern 186.

Referring to FIG. 33, for example, a dry etching process may be performed to remove portions of the second etch stop layer 530, the sacrificial pattern 500 and the third insulation pattern 140.

Thus, the second etch stop layer 530 may be divided into a plurality of second etch stop patterns 535 each of which may extend in the second direction D2, and the second etch stop pattern 535, the sixth insulating interlayer pattern 520, the third metal pattern 186 and the third insulation pattern 140 may collectively form a fourth bar structure extending in the second direction D2. A sixth opening 540 exposing the upper surfaces of the bit line 130 and the first insulating interlayer pattern 150 may be formed between neighboring ones of the fourth bar structures in the first direction D1.

Referring to FIG. 30 again, processes substantially the same as or similar to those illustrated with reference to FIGS. 27 to 29 and FIG. 25 may be performed to complete the fabrication of the semiconductor device.

While aspects of the present inventive concept have been shown and described with reference to example embodiments thereof, it will be understood by those of ordinary skill in the art that various changes in form and details may be made thereto without departing from the spirit and scope of the aspects of the present inventive concept as set forth by the following claims.

What is claimed is:

1. A semiconductor device comprising:
a substrate;
bit lines disposed on the substrate, the bit lines extending in a first direction parallel to an upper surface of the substrate and spaced apart from each other in a second direction parallel to the upper surface of the substrate and crossing the first direction;
gate electrodes disposed on the bit lines, the gate electrodes spaced apart from each other in the first direction and extending in the second direction;
gate insulation patterns disposed on sidewalls, in the first direction, of the gate electrodes, respectively;
channel structures disposed on sidewalls, in the first direction, of the gate insulation patterns, respectively;
metal oxide patterns disposed on sidewalls, in the first direction, of the channel structures, respectively; and
metal patterns disposed on sidewalls, in the first direction, of the metal oxide patterns, respectively.

2. The semiconductor device according to claim 1, wherein the channel structures include a crystalline oxide semiconductor material.

3. The semiconductor device according to claim 2, wherein the channel structures include:
crystalline channels including the crystalline oxide semiconductor material; and
amorphous channels disposed on and beneath the crystalline channels, respectively, the amorphous channels including an amorphous oxide semiconductor material.

4. The semiconductor device according to claim 3, wherein upper surfaces of the crystalline channels are coplanar with upper surfaces of the metal patterns and the metal oxide patterns.

5. The semiconductor device according to claim 3, wherein ones of the amorphous channels disposed beneath corresponding ones of the crystalline channels that contact respective sidewalls of neighboring ones of the metal oxide patterns in the first direction are connected with each other.

6. The semiconductor device according to claim 5, wherein ones of the gate insulation patterns contacting respective sidewalls of neighboring ones of the crystalline channels in the first direction are connected with each other on the ones of the amorphous channels connected with each other.

7. The semiconductor device according to claim 1, wherein ones of the metal patterns contacting respective sidewalls of neighboring ones of the metal oxide patterns in the first direction are connected with each other.

8. The semiconductor device according to claim 7, wherein a cross-section of the ones of the metal patterns connected with each other has a cup shape in the first direction.

9. The semiconductor device according to claim 7, further comprising an etch stop pattern on each of the metal patterns, an upper surface of the etch stop pattern being coplanar with uppermost surfaces of the gate insulation patterns, and the etch stop pattern including silicon nitride.

10. The semiconductor device according to claim 1, further comprising:

an insulating interlayer pattern on the metal patterns and the metal oxide patterns, the insulating interlayer pattern including silicon oxide; and an etch stop pattern on the insulating interlayer pattern, an upper surface of the etch stop pattern being coplanar with uppermost surfaces of the gate insulation patterns, and the etch stop pattern including silicon nitride.

11. The semiconductor device according to claim 1, further comprising:

contact plugs contacting upper surfaces of the channel structures, respectively, the contact plugs being disposed at respective areas where the bit lines and the gate electrodes cross each other in a third direction perpendicular to the upper surface of the substrate; and capacitors on the contact plugs, respectively.

12. The semiconductor device according to claim 11, wherein each of the contact plugs includes a lower portion and an upper portion, the upper portion having a width greater than a width of the lower portion in the first direction, and wherein a lower surface of the lower portion of each of the contact plugs is lower than upper surfaces of the gate insulation patterns and higher than upper surfaces of the metal patterns in the third direction.

13. The semiconductor device according to claim 1, wherein the metal patterns include titanium, tantalum, molybdenum or tungsten.

14. A semiconductor device comprising:

a substrate;

bit lines disposed on the substrate, the bit lines extending in a first direction parallel to an upper surface of the substrate, and spaced apart from each other in a second direction parallel to the upper surface of the substrate and crossing the first direction;

gate electrodes disposed on the bit lines, the gate electrodes spaced apart from each other in the first direction and extending in the second direction;

gate insulation patterns disposed on sidewalls, in the first direction, of the gate electrodes, respectively;

channel structures disposed on sidewalls, in the first direction, of the gate insulation patterns, respectively; and metal patterns on sidewalls, in the first direction, of the channel structure, respectively, wherein the channel structures include:

crystalline channels including a crystalline oxide semiconductor material; and amorphous channels on and beneath the crystalline channels, respectively, the amorphous channels including an amorphous oxide semiconductor material.

15. The semiconductor device according to claim 14, wherein upper surfaces of the crystalline channels are coplanar with upper surfaces of the metal patterns.

16. The semiconductor device according to claim 14, wherein ones of the amorphous channels disposed beneath corresponding ones of the crystalline channels that contact respective sidewalls of neighboring ones of the metal patterns in the first direction are connected with each other.

17. The semiconductor device according to claim 16, wherein ones of the gate insulation patterns that contacts respective sidewalls of neighboring ones of the crystalline channels in the first direction are connected with each other on the ones of the amorphous channels connected with each other.

18. The semiconductor device according to claim 14, wherein ones of the metal patterns that contact respective sidewalls of neighboring ones of the channel structures in the first direction are connected with each other.

19. The semiconductor device according to claim 14, further comprising a metal oxide pattern between one of the channel structures and a corresponding one of the metal patterns.

20. A semiconductor device comprising:

a substrate;

bit lines disposed on the substrate, the bit lines extending in a first direction parallel to an upper surface of the substrate and spaced apart from each other in a second direction parallel to the upper surface of the substrate and crossing the first direction;

gate electrodes disposed on the bit lines, the gate electrodes spaced apart from each other in the first direction and extending in the second direction;

a gate insulation pattern disposed on a sidewall, in the first direction, of each of the gate electrodes;

a channel structure disposed on a sidewall, in the first direction, of the gate insulation pattern, the channel structure including:

a crystalline channel including a crystalline oxide semiconductor material; and an amorphous channel on and beneath the crystalline channel, the amorphous channel including an amorphous oxide semiconductor material;

a metal oxide pattern disposed on a sidewall, in the first direction, of the channel structure;

a metal pattern disposed on a sidewall, in the first direction, of the metal oxide pattern;

a contact plug contacting an upper surface of the channel structure, the contact plug being disposed at each of areas where the bit lines and the gate electrodes cross each other in a third direction perpendicular to the upper surface of the substrate; and a capacitor disposed on the contact plug.

\* \* \* \* \*